(12) United States Patent
Kondo

(10) Patent No.: US 7,092,588 B2
(45) Date of Patent: Aug. 15, 2006

(54) OPTICAL INTERCONNECTION CIRCUIT BETWEEN CHIPS, ELECTROOPTICAL DEVICE AND ELECTRONIC EQUIPMENT

(75) Inventor: Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/690,530

(22) Filed: Oct. 23, 2003

(65) Prior Publication Data

US 2004/0136639 A1 Jul. 15, 2004

(30) Foreign Application Priority Data

Nov. 20, 2002 (JP) ............................. 2002-336544

(51) Int. Cl.
*G02B 6/12* (2006.01)
(52) U.S. Cl. ............................. 385/14; 385/49; 385/88; 385/89; 385/132; 385/129; 385/130; 385/131
(58) Field of Classification Search ................. 385/14, 385/15, 24, 4, 8, 88, 92, 129, 130, 131, 132, 385/49
See application file for complete search history.

(56) References Cited

U.S. PATENT DOCUMENTS

| | | | |
|---|---|---|---|
| 5,073,230 A | 12/1991 | Maracas et al. | |
| 5,244,818 A | 9/1993 | Jokerst et al. | |
| 5,262,351 A * | 11/1993 | Bureau et al. | 257/81 |
| 5,280,184 A | 1/1994 | Jokerst et al. | |
| 5,286,335 A | 2/1994 | Drabik et al. | |
| 5,391,257 A | 2/1995 | Sullivan et al. | |
| 5,401,983 A | 3/1995 | Jokerst et al. | |
| 5,465,009 A | 11/1995 | Drabik et al. | |
| 5,827,751 A | 10/1998 | Nuyen | |
| 6,033,995 A | 3/2000 | Muller | |
| 6,214,733 B1 | 4/2001 | Sickmiller | |
| 6,477,286 B1 * | 11/2002 | Ouchi | 385/14 |
| 6,522,794 B1 * | 2/2003 | Bischel et al. | 385/4 |
| 6,611,635 B1 * | 8/2003 | Yoshimura et al. | 385/14 |
| 6,690,845 B1 * | 2/2004 | Yoshimura et al. | 385/14 |
| 6,693,736 B1 * | 2/2004 | Yoshimura et al. | 359/333 |
| 2003/0007736 A1 * | 1/2003 | Harada | 385/49 |
| 2004/0109629 A1 * | 6/2004 | Kondo | 385/14 |
| 2004/0264867 A1 * | 12/2004 | Kondo | 385/49 |

* cited by examiner

Primary Examiner—Brian M. Healy
(74) Attorney, Agent, or Firm—Oliff & Berridge, PLC

(57) ABSTRACT

The invention provides an optical interconnection circuit between chips, an electrooptical device including the circuit, and electronic equipment including the circuit. In particular, the invention provides such a circuit, device, and equipment in which a signal transmission speed can be increased, and which can be easily microminiaturized and manufactured. An optical interconnection circuit between chips includes a substrate, a micro tile element having a light emitting function which is provided on the substrate, the micro tile element having a light receiving function which is provided on the substrate, an optical wave-guide optically connecting the micro tile element having a light emitting function and the micro tile element having a light receiving function with each other and including an optical wave-guide member formed on the substrate, and an electrode provided on the substrate and electrically connected to the micro tile element having a light emitting function or the micro tile element having a light receiving function.

20 Claims, 25 Drawing Sheets

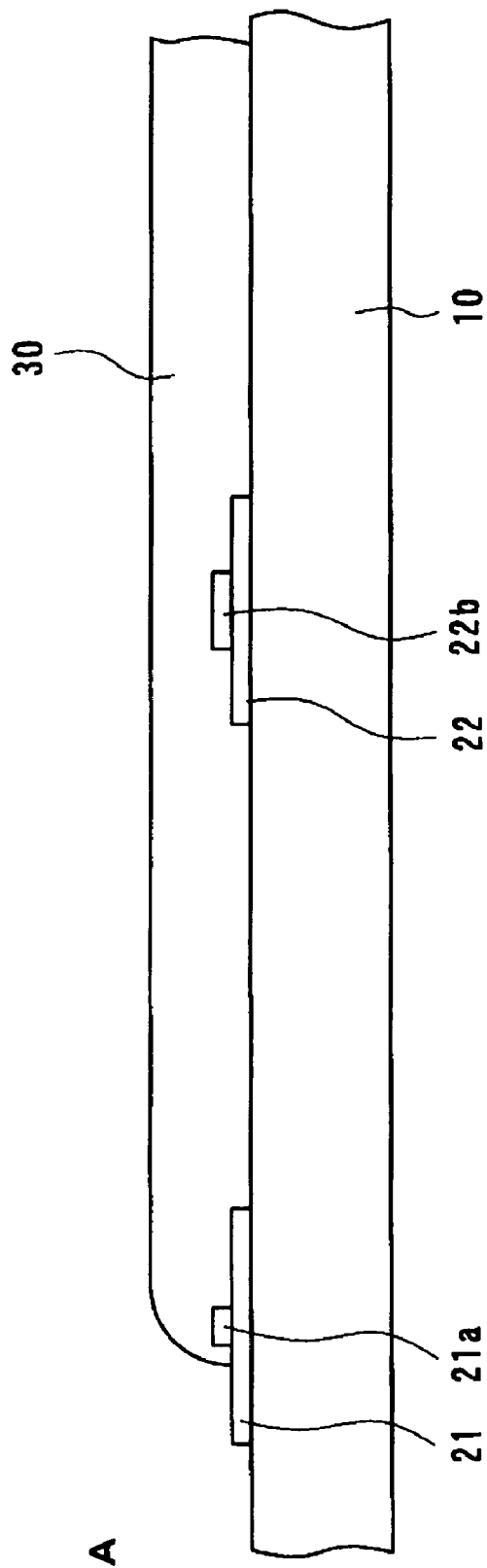
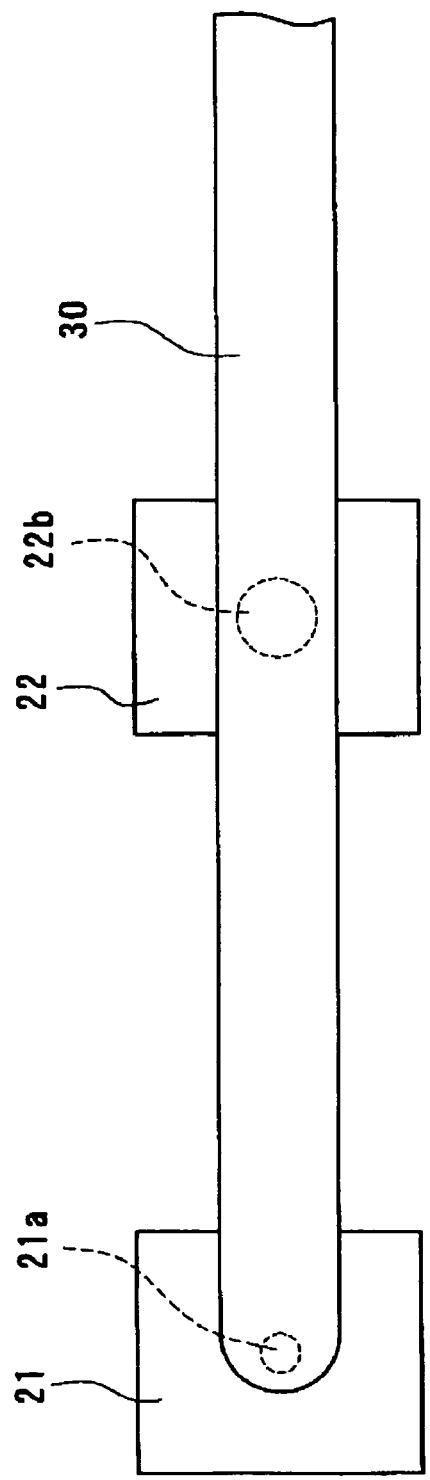

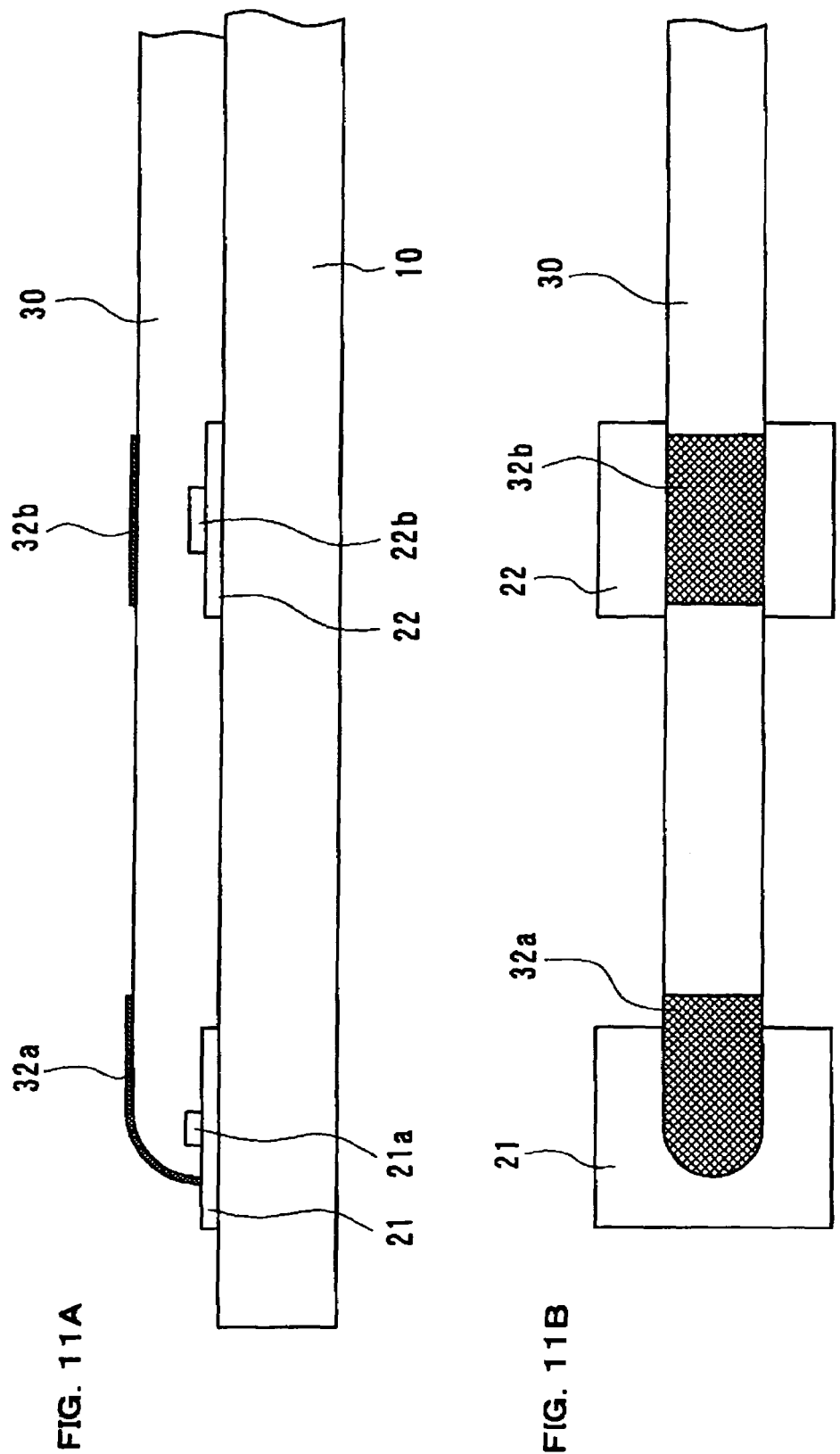

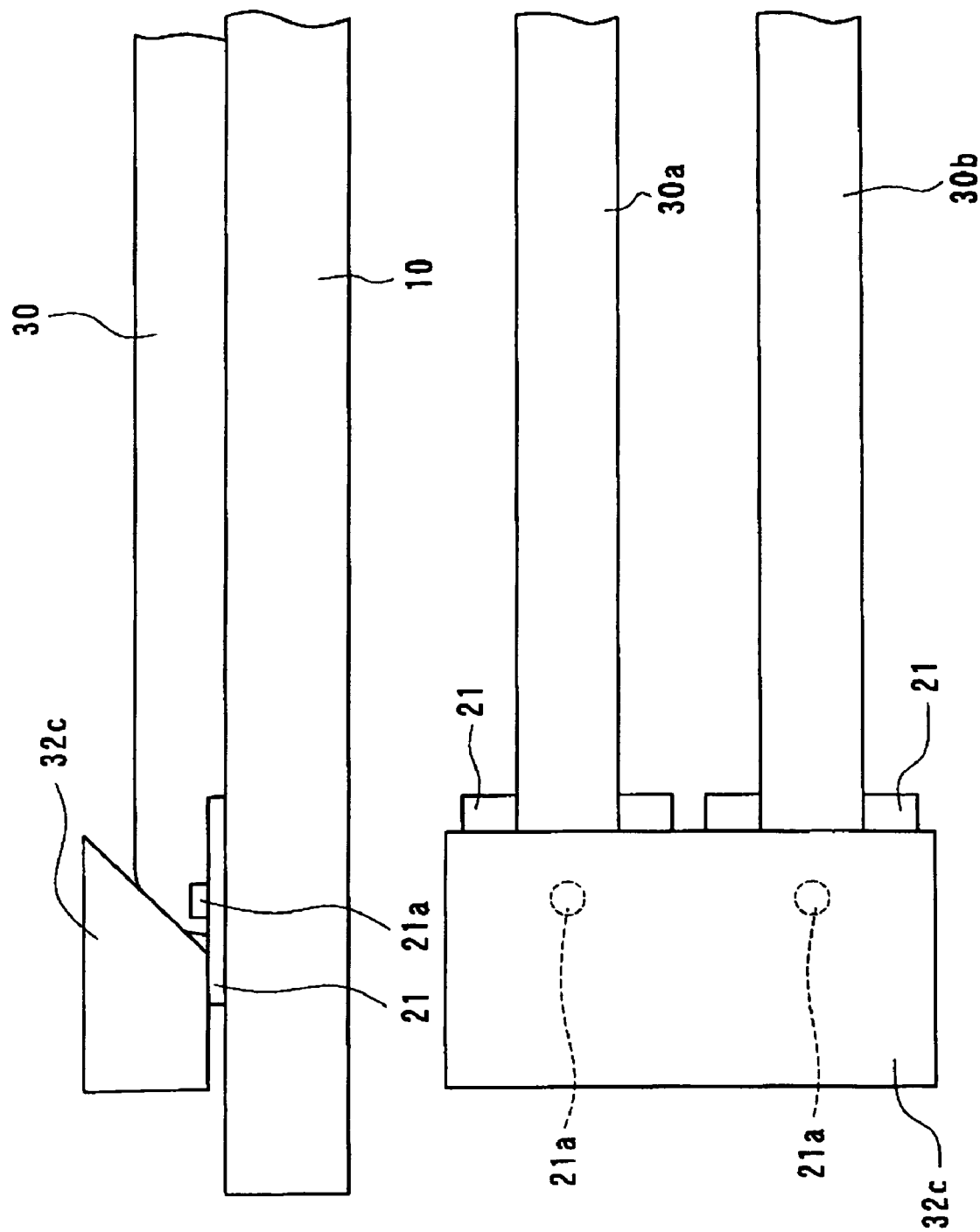

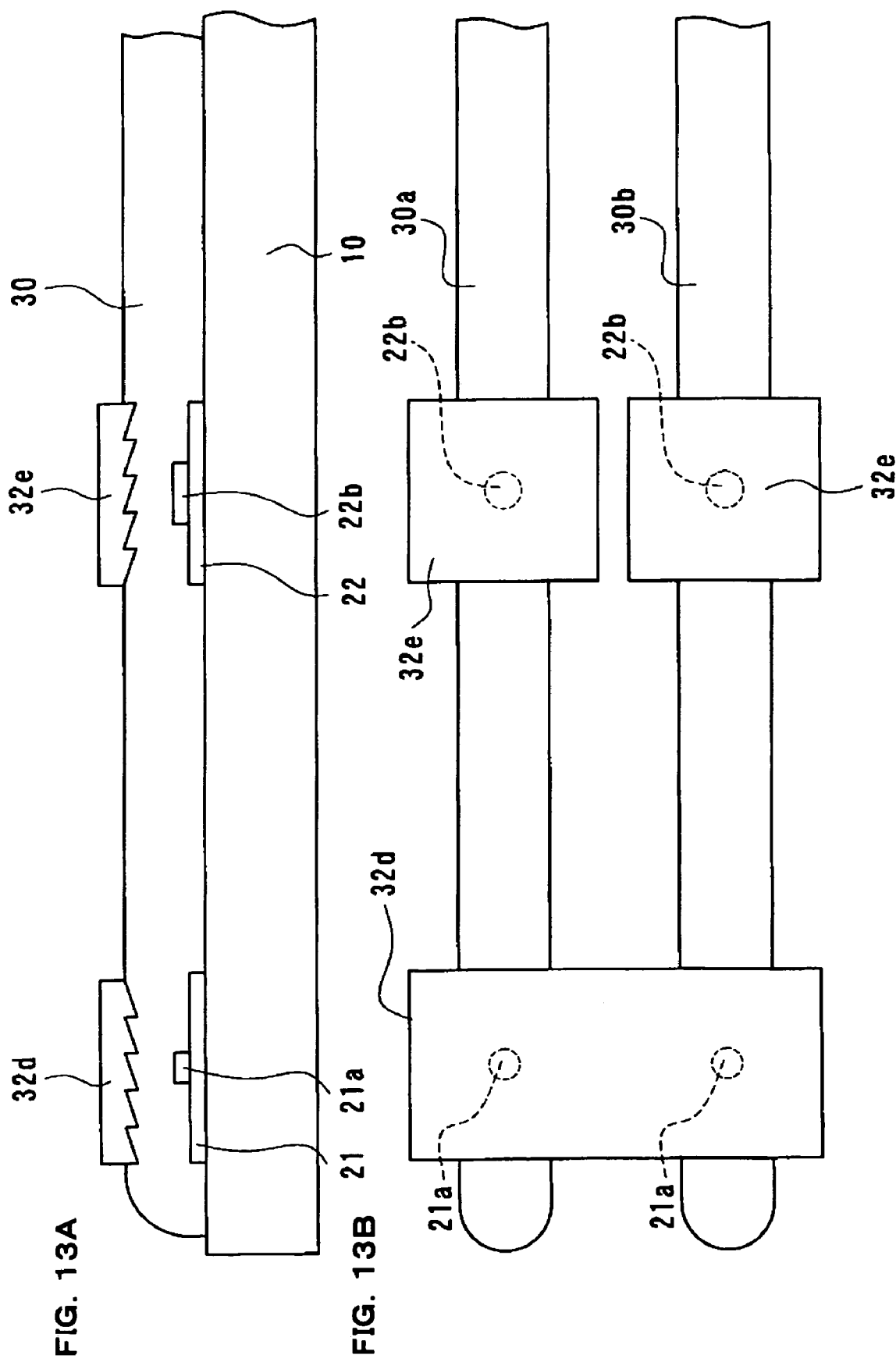

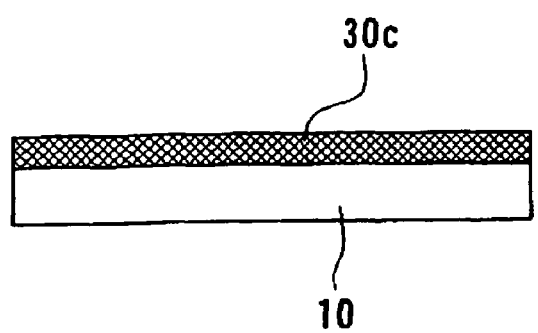
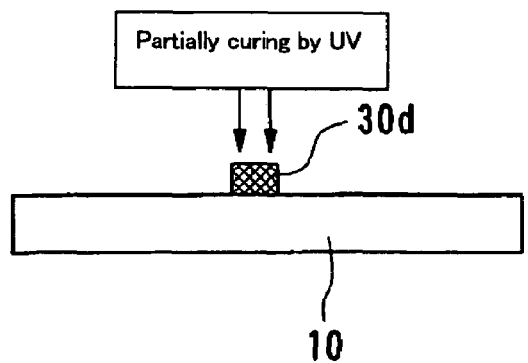
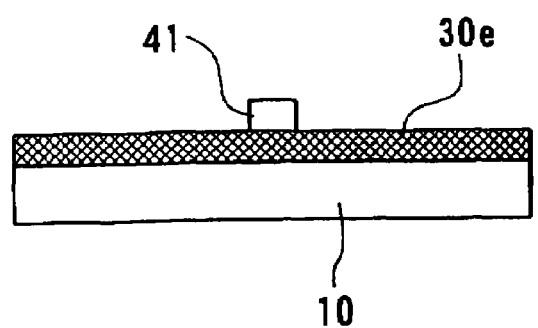
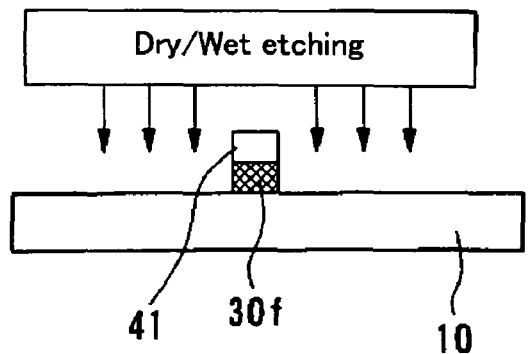
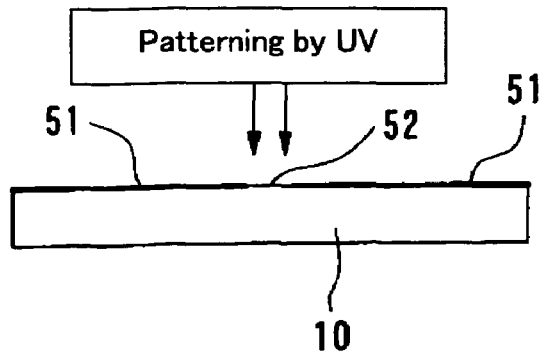
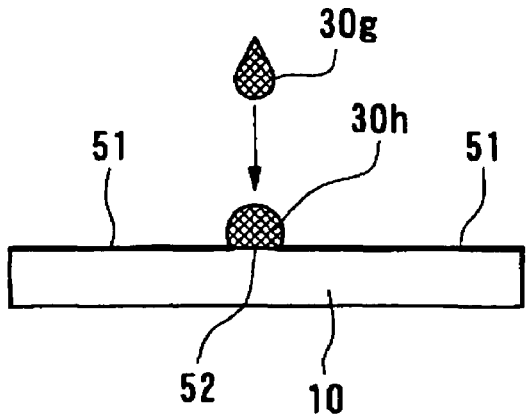

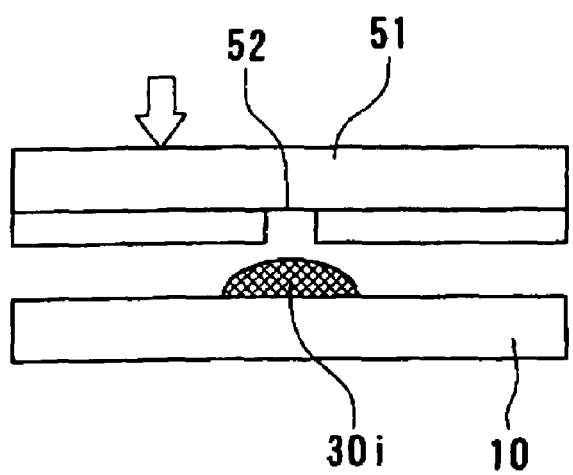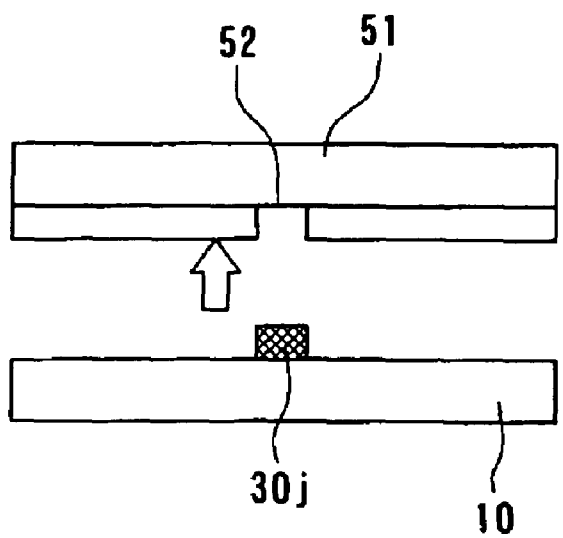
FIG. 17A
FIG. 17B

OPTICAL INTERCONNECTION CIRCUIT BETWEEN CHIPS, ELECTROOPTICAL DEVICE AND ELECTRONIC EQUIPMENT

BACKGROUND OF THE INVENTION

1. Field of Invention

The present invention relates to an optical interconnection circuit between chips, an electrooptical device, and electronic equipment.

2. Description of Related Art

In the related art, an electro luminescence panel (ELP), a plasma display panel (PDP), a liquid crystal display device (LCD), and the like are used as a flat display device. In these flat display devices, technology using light for signal transmission can be used in order to reduce or eliminate delays in transmitting signals and the like in response to an increase in the size of a display and in the amount of contents displayed.

Furthermore, in the related art, the operation speed (operation clock) inside a CPU in a computer has been enhanced with the increased microminiaturization of an inside structure of an integrated circuit. However, the signal transmission speed of a bus connecting a CPU to a peripheral device, such as a storage device, almost reaches a limit, and becomes a bottleneck of the processing speed of a computer. If an optical signal is available to transmit a signal in a bus, the limit of the processing speed of a computer can be remarkably enhanced.

In addition, an optical transmission device, which transmits an optical signal emitted from a light source to a predetermined sink so as to input the optical signal to a light receiving element and the like, is needed in order to transmit a datum by using an optical signal. In the related art, such an optical transmission device relates to technology utilizing an optical fiber and technology utilizing an optical wave-guide formed on a substrate.

SUMMARY OF THE INVENTION

However, when an optical fiber is utilized as an optical transmission device, connecting the optical fiber to an optical part, such as a light emitting element and a light receiving element, is so complicated that it is expensive and takes a lot of time to manufacture, and it is difficult to miniaturize such an optical transmission device.

Meanwhile, it is considered that an optical transmission medium is easily connected to a light emitting element, a light receiving element, and the like by utilizing an optical wave-guide formed on a substrate. However, the related art does not include an input/output structure suitable for an optical wave-guide. Therefore, the related art does not include a technology for microminiaturizing an optical transmission device and facilitating manufacturing of the same to the extent that such a device can be applied to a flat display device or a computer.

In view of the above and/or other problems, the present invention provides an optical interconnection circuit between chips, of which signal transmission speed can be enhanced, and which can be easily microminiaturized and manufactured; an electrooptical device including the circuit; and electronic equipment including the circuit.

To address or achieve the above, an optical interconnection circuit between chips of the present invention includes a substrate, a first micro tile element having a light emitting function which is provided on the substrate, and a second micro tile element having a light receiving function which is provided on the substrate. The optical interconnection circuit between chips also includes an optical wave-guide optically connecting the first micro tile element and the second micro tile element with each other, and including an optical wave-guide member formed on the substrate, and an electrode provided on the substrate and electrically connected to the first micro tile element or the second micro tile element.

According to the present invention, applying an electrical signal to the electrode provided on the substrate enables the first micro tile element connected to the electrode to emit an optical signal. The optical signal goes through the optical wave-guide to reach the second micro tile element, where it is converted into an electrical signal. Therefore, an optical signal is sent and received between the micro tile elements so that a signal transmission device of very high speed can be easily realized. Furthermore, a microminiaturized signal transmission device can be easily manufactured by adopting a microminiaturized form for the micro tile element (for example, which has an area of several hundred μm square or less and a depth of several dozen μm or less). In the present invention, transparent resin or sol-gel glass can be applied as the optical wave-guide member forming the optical wave-guide. Sol-gel glass is solid glass transformed by heating a solution including a glass component, and the like.

Furthermore, in the optical interconnection circuit between chips of the present invention, it is preferable that the electrode is a bonding pad which is a wiring electrode for an integrated circuit chip mounted onto the substrate.

According to the present invention, a connection terminal (an input/output terminal) of the integrated circuit chip mounted onto the substrate is electrically connected to the micro tile element through the bonding pad formed on the substrate. Namely, an input/output signal (an electrical signal) from and to the integrated circuit chip is sent and received to and from the micro tile element through the bonding pad. Thus, an input/output signal from and to the integrated circuit chip mounted onto the substrate is converted into an optical signal, and thereby it can be transmitted at very high speed on the substrate.

Furthermore, in the optical interconnection circuit between chips of the present invention, it is preferable that the electrode is a bonding pad in a case of an integrated circuit chip being flip-chip mounted onto the substrate.

According to the present invention, the integrated circuit chip can be flip-chip mounted onto the bonding pad formed on the substrate. Therefore, the integrated circuit chip can be easily mounted onto the substrate in a compact manner. At the same time, an input/output signal from and to the integrated circuit chip is converted into an optical signal, and thereby it can be transmitted at high speed.

Furthermore, in the optical interconnection circuit between chips of the present invention, it is preferable that a bump, which is composed of a convex conductive member, is formed on the integrated circuit chip, and that the bump is electrically connected to an input terminal or an output terminal of the integrated circuit chip and is bonded to the electrode.

According to the present invention, the integrated circuit chip can be electrically and mechanically connected to the substrate by using the bonding pad and the bump. Therefore, the integrated circuit chip can be directly and easily mounted onto the substrate. At the same time, an input/output signal from and to the integrated circuit chip is converted into an optical signal, and thereby it can be transmitted at high speed.

Furthermore, in the optical interconnection circuit between chips of the present invention, it is preferable that the integrated circuit chip includes a plurality of integrated circuit chips which are mounted onto the substrate, and that a signal is transmitted among a plurality of the integrated circuit chips via at least the first micro tile element, the second micro tile element, and the optical wave-guide.

According to the present invention, a datum is transmitted at high speed among a plurality of the integrated circuit chips mounted onto the substrate by using an optical signal transmitting in the optical wave-guide.

Furthermore, in the optical interconnection circuit between chips of the present invention, it is preferable that the second micro tile element includes a plurality of second micro tile elements, and that a plurality of the second micro tile elements are optically connected to a single of the optical wave-guide.

According to the present invention, a single of the optical wave-guide can almost simultaneously transmit an optical signal to a plurality of the micro tile elements so that a bus using an optical signal can be easily realized.

Furthermore, in the optical interconnection circuit between chips of the present invention, it is preferable that the first micro tile element emits light which is to be a clock signal.

According to the present invention, a clock signal is converted into an optical signal to be transmitted so that a clock signal, whose frequency is higher than a related art one, can be transmitted with a simple structure.

Furthermore, in the optical interconnection circuit between chips of the present invention, it is preferable that the substrate is an element of a flat panel display, and that at least an integrated circuit to time control and an integrated circuit to provide driving are mounted onto the substrate as the integrated circuit chip. It is also preferable that at least a single of the optical wave-guide is provided between the integrated circuit to time control and the integrated circuit to provide driving.

According to the present invention, in the flat panel display, the integrated circuit to time control and the integrated circuit to provide driving (an integrated circuit to drive a data line, an integrated circuit to drive a scan line) can be connected through the optical wave-guide. The integrated circuit to time control produces a signal (a data signal, a scan signal, and the like) which controls each pixel based on a video signal, while the integrated circuit to provide driving receives and amplifies a signal output from the integrated circuit to time control so as to drive each pixel. Therefore, the speed of data transmission between the integrated circuit to time control and the integrated circuit to provide driving can be greatly increased by an optical signal on the substrate forming the flat panel display.

A single or a plurality of the first micro tile elements or the second micro tile elements are electrically connected to each of the integrated circuit to time control and the integrated circuit to provide driving. Furthermore, the integrated circuit to time control and the integrated circuit to provide driving can be connected through a single or a plurality of the optical wave-guides.

In addition, according to the present invention, the first micro tile element can be driven by a simple driver. This makes it possible to make a circuit arrangement of the flat panel display simple, and thereby manufacturing cost can be reduced.

Furthermore, according to the present invention, a video signal is transmitted as an optical signal, so that an electromagnetic wave radiated from a screen can be greatly reduced, and thereby electromagnetic interference (EMI) can be greatly reduced or prevented.

Furthermore, in the optical interconnection circuit between chips of the present invention, it is preferable that the integrated circuit to provide driving includes a plurality of integrated circuits to provide driving which are mounted onto the substrate, and that at least a single of the optical wave-guide is provided for each of the integrated circuits to provide driving.

According to the present invention, for example, each integrated circuit to provide driving includes a plurality of integrated circuits to provide driving (which drive and control a plurality of data lines or a plurality of scan lines), and each of the integrated circuits to provide driving outputs a data signal or a scan signal to a pixel matrix. Thus, a data signal or a scan signal can be transmitted at high speed to each integrated circuit to provide driving through a single or a plurality of the optical wave-guides. Therefore, the speed of data transmission can be increased, while manufacturing cost can be reduced with a simple circuit arrangement of the flat panel display.

Furthermore, in the optical interconnection circuit between chips of the present invention, it is preferable that the integrated circuit to time control is electrically connected to the first micro tile element which corresponds to the integrated circuit to provide driving mounted onto the substrate.

According to the present invention, since the integrated circuit to time control includes the first micro tile element, the integrated circuit to time control capable of outputting an optical signal can be easily formed in a compact manner. Therefore, the speed of data transmission between the integrated circuit to time control and the integrated circuit to provide driving can be greatly increased by an optical signal. At the same time, a circuit arrangement of the flat panel display can be made simpler, and thereby manufacturing cost can be reduced.

Furthermore, in the optical interconnection circuit between chips of the present invention, it is preferable that the integrated circuit to provide driving is electrically connected to at least a single of the second micro tile element.

According to the present invention, the integrated circuit to provide driving capable of converting an optical signal into an electrical signal can be easily formed in a compact manner.

Furthermore, in the optical interconnection circuit between chips of the present invention, it is preferable that the optical wave-guide is treated to reduce or prevent extraneous light from entering the optical wave-guide.

According to the present invention, malfunction due to extraneous light, such as natural light, artificial light in a room, or light leaked from other optical wave-guides, can be reduced or avoided.

Furthermore, in the optical interconnection circuit between chips of the present invention, it is preferable that the first micro tile element includes a plurality of first micro tile elements provided on the substrate, and that a plurality of the first micro tile elements emit light to the optical wave-guide. A plurality of the first micro tile elements emit lights having at least two kinds of wavelengths different from each other to the optical wave-guide.

According to the present invention, since a single of the optical wave-guide simultaneously transmits multiple kinds of optical signals, the speed of signal transmission can be further increased, while a more compact signal transmission device can be provided.

An electrooptical device of the present invention includes the optical interconnection circuit between chips.

According to the present invention, transmitting a scan signal, a data signal, and the like of a flat display by the optical interconnection circuit enables each pixel to be driven and controlled at high speed. This makes it possible to increase the size and quality of a screen of a flat display device, as well as further miniaturizing such a device.

Electronic equipment of the present invention includes the optical interconnection circuit between chips.

According to the present invention, compact and high-performance electronic equipment which process a signal at high speed can be provided economically by, for example, applying the optical interconnection circuit of the present invention between a CPU and a storage device.

Furthermore, according to the present invention, electronic equipment capable of displaying an image of high quality can be provided economically by, for example, applying the optical interconnection circuit to a display device.

BRIEF DESCRIPTION OF THE DRAWINGS

FIGS. 6A and 6B are schematics of a circuit element according to an exemplary embodiment of the present invention;

FIGS. 11A and 11B are side views showing an exemplary modification of the circuit element according to the exemplary embodiment of the present invention;

FIGS. 12A and 12B are side views showing an exemplary modification of the circuit element according to the exemplary embodiment of the present invention;

FIGS. 13A and 13B are side views showing an exemplary modification of the circuit element according to the exemplary embodiment of the present invention;

FIGS. 14A and 14B are schematic side views showing a method of manufacturing according to an exemplary embodiment of the present invention;

FIGS. 15A and 15B are schematic side views showing one of other examples of the method of manufacturing according to the exemplary embodiment of the present invention;

FIGS. 16A and 16B are schematic side views showing one of other examples of the method of manufacturing according to the exemplary embodiment of the present invention;

FIGS. 17A and 17B are schematic side views showing one of other examples of the method of manufacturing according to the exemplary embodiment of the present invention;

DETAILED DESCRIPTION OF PREFERRED EMBODIMENTS

The optical interconnection circuit between chips according to the present invention is described below referring to the accompanying drawings.

First Exemplary Embodiment

Figure 1:
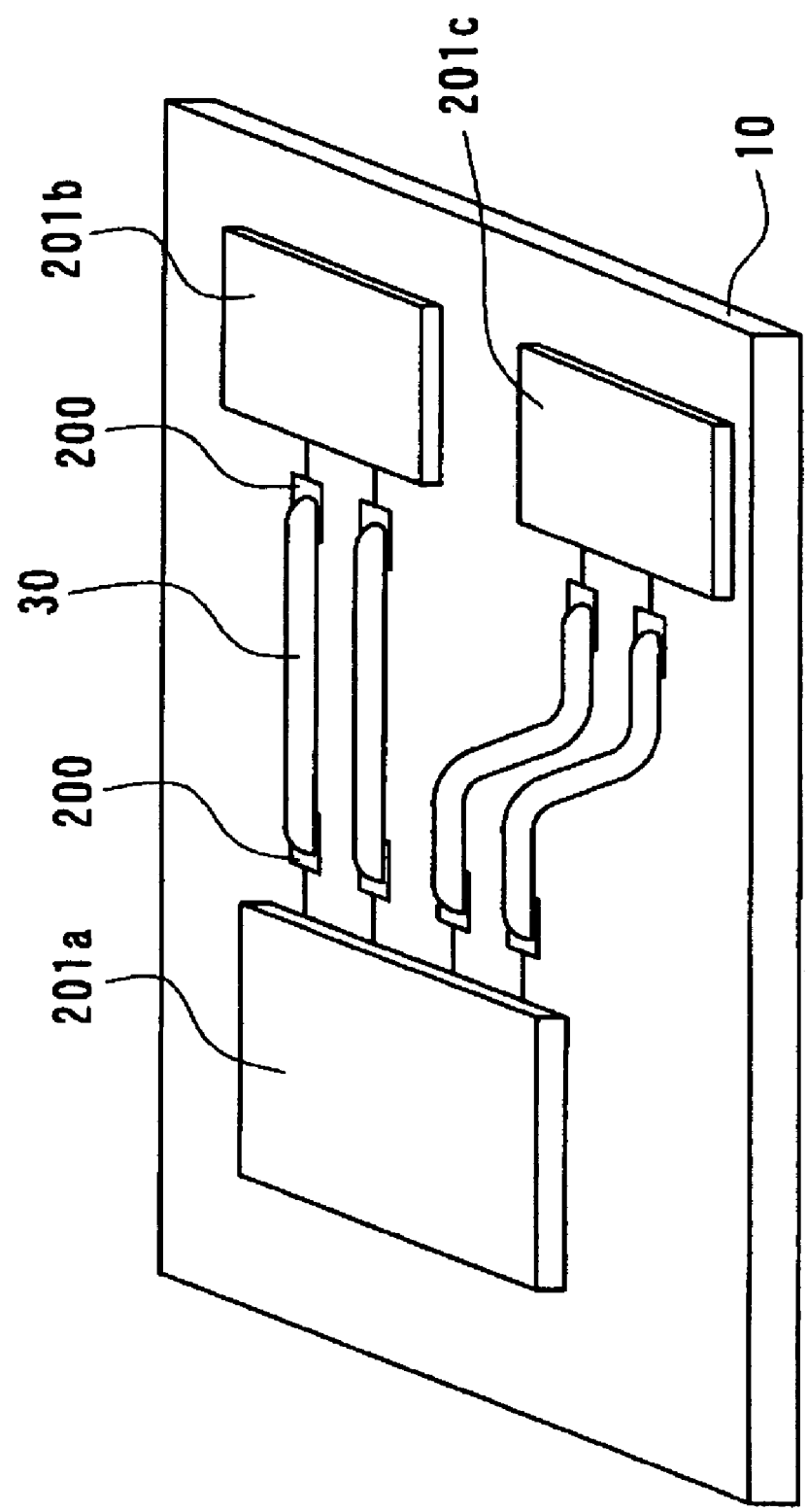
FIG. 1 is a perspective view of a circuit according to a first exemplary embodiment of the present invention.
Figure 2:
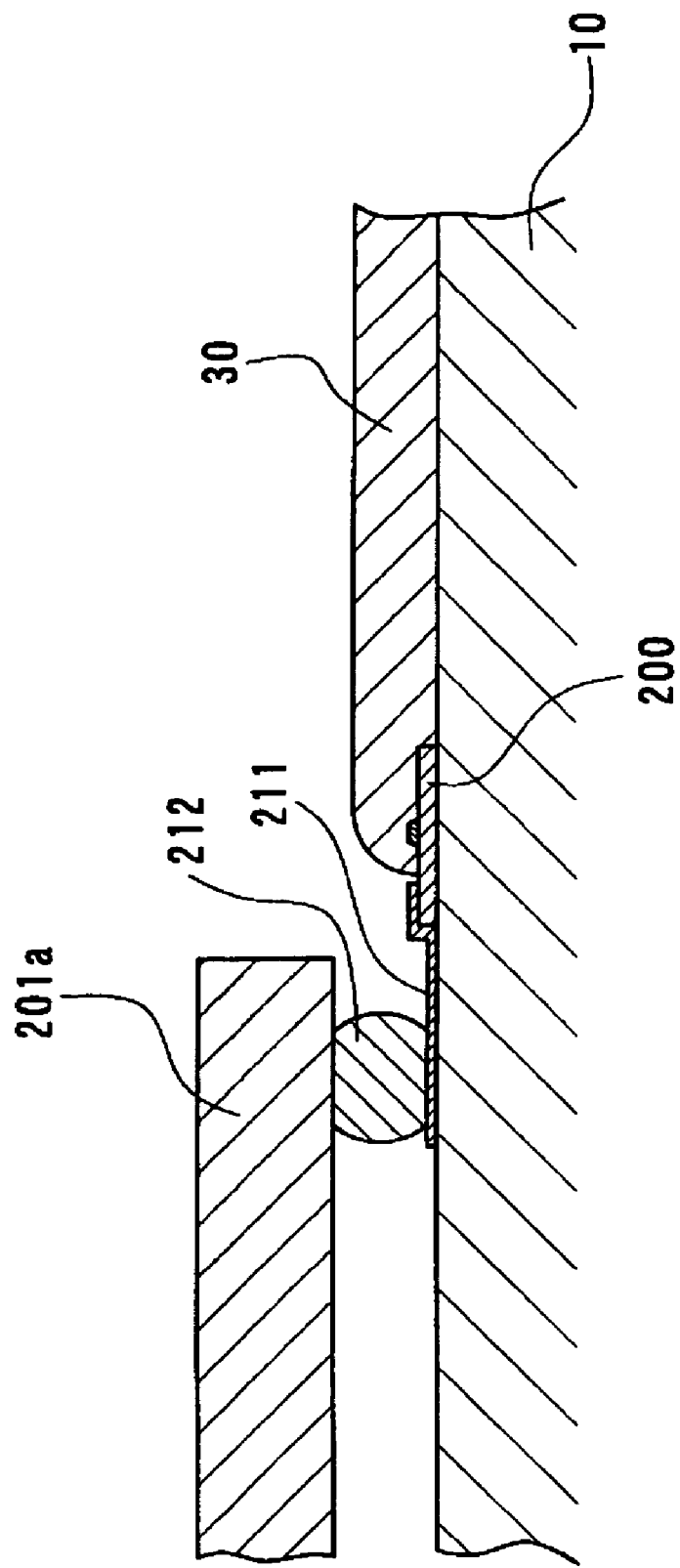
FIG. 2 is a sectional view of a significant part of the circuit according to the first exemplary embodiment of the present invention.

FIG. 1 is a perspective view of the optical interconnection circuit between chips according to a first exemplary embodiment of the present invention. FIG. 2 is a sectional view showing a main part of the optical interconnection circuit between chips shown in FIG. 1. In the present exemplary embodiment, a plurality of integrated circuit chips (IC chips, LSI chips, and the like) disposed on a substrate are connected each other by using an optical wave-guide 30.

LSIs 201a, 201b and 201c including a plurality of integrated circuits are mounted onto a top surface of a substrate 10. The optical wave-guide 30 that includes a plurality of optical wave-guides and a micro tile element 200 that includes a plurality of micro tile elements are also formed on the top surface of the substrate 10. Any materials, such as glass epoxy, ceramic, glass, plastic, semiconductor, and silicon can be used for the substrate 10. Each of the LSIs 201a, 201b and 201c includes a semiconductor chip, and is flip-chip mounted onto the top surface of the substrate 10 as shown in FIG. 2. Each of the LSIs 201a, 201b and 201c may be mounted onto the substrate 10 by a method other than flip-chip mounting.

The micro tile element 200 is a micro tile element having a light emitting or light receiving function. Furthermore, the micro tile element 200 having a light emitting function is paired with the micro tile element 200 having a light receiving function, being provided to each end of a single of the optical wave-guide 30. Namely, the micro tile element 200 having a light emitting function and the micro tile element 200 having a light receiving function are optically connected each other through the optical wave-guide 30.

In particular, as shown in FIG. 2, the micro tile element 200 is each connected to an electrode (a bonding pad) 211 formed on the substrate 10. A general flip-chip mounting method is available to mount the LSIs 201a, 201b and 201c onto the substrate 10. For example, a bump 212 provided to a connection terminal of the LSIs 201a, 201b and 201c is pressure-bonded, or connected through a conductive paste or an anisotropic conductive material, to the electrode 211. These methods allow the LSIs 201a, 201b and 201c, and the micro tile element 200 to be electrically connected each other through the bump 212 and the electrode 211.

Then, for example, an output signal (an electrical signal) from the LSI 201a is sent to the micro tile element 200 via the bump 212 and the electrode (the bonding pad) 211.

The output signal is converted into an optical pulse signal by the micro tile element 200 disposed in the vicinity of the LSI 201a so as to transmit in the optical wave-guide 30. The optical pulse signal is converted into an electrical signal by the micro tile element 200 disposed in the vicinity of the LSI 201b, which is an end of the optical wave-guide 30, so as to become an input signal to the LSI 201b.

In the present exemplary embodiment, an optical bus may be formed by connecting the micro tile element 200 having a light emitting function here including a plurality of micro tile elements to a single of the optical wave-guide 30. This, for example, enables a clock signal shared by a plurality of the LSIs 201a, 201b and 201c to be distributed by the optical wave-guide 30.

Second Exemplary Embodiment

Figure 3:
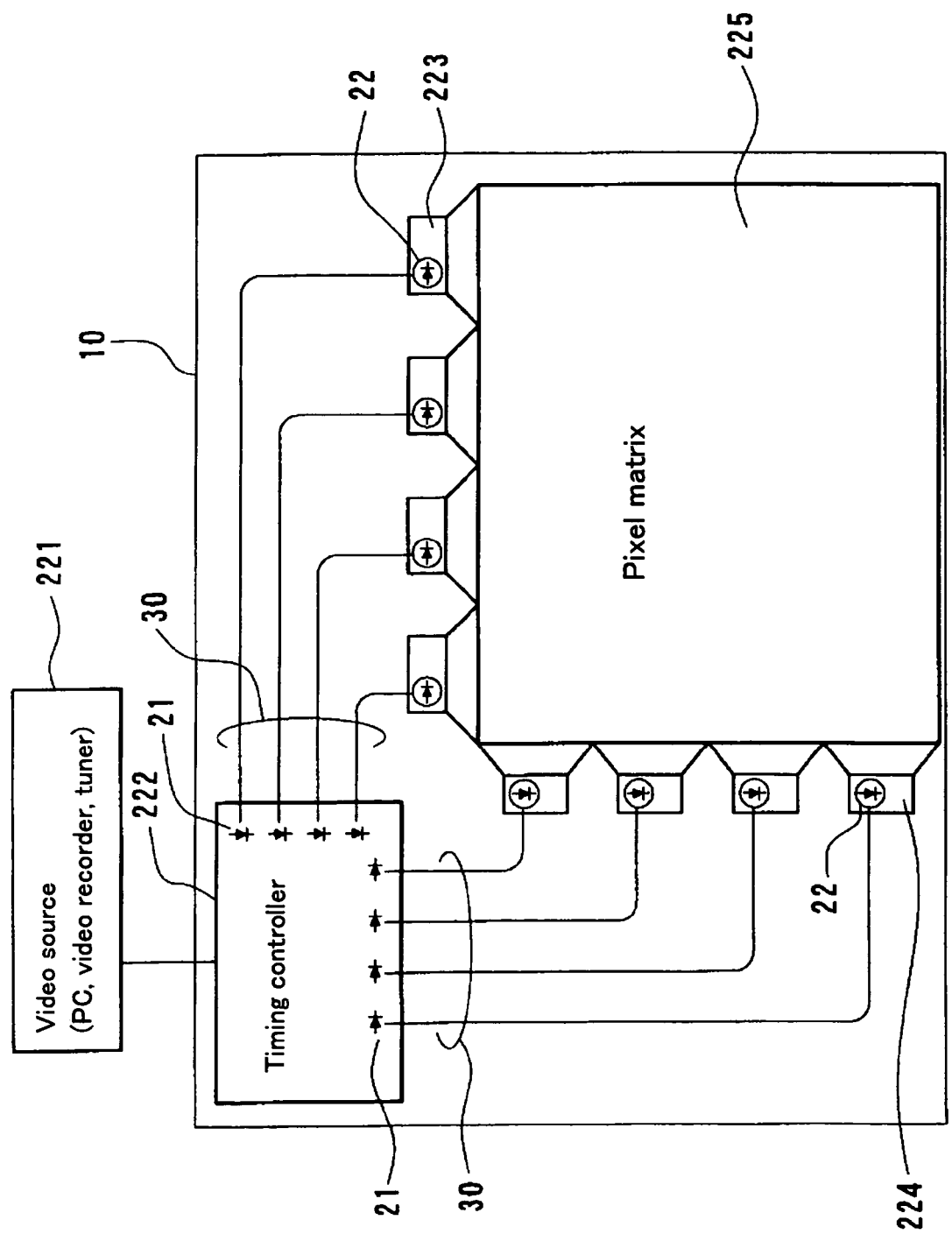
FIG. 3 is a perspective view of a circuit according to a second exemplary embodiment of the present invention.
Figure 4:
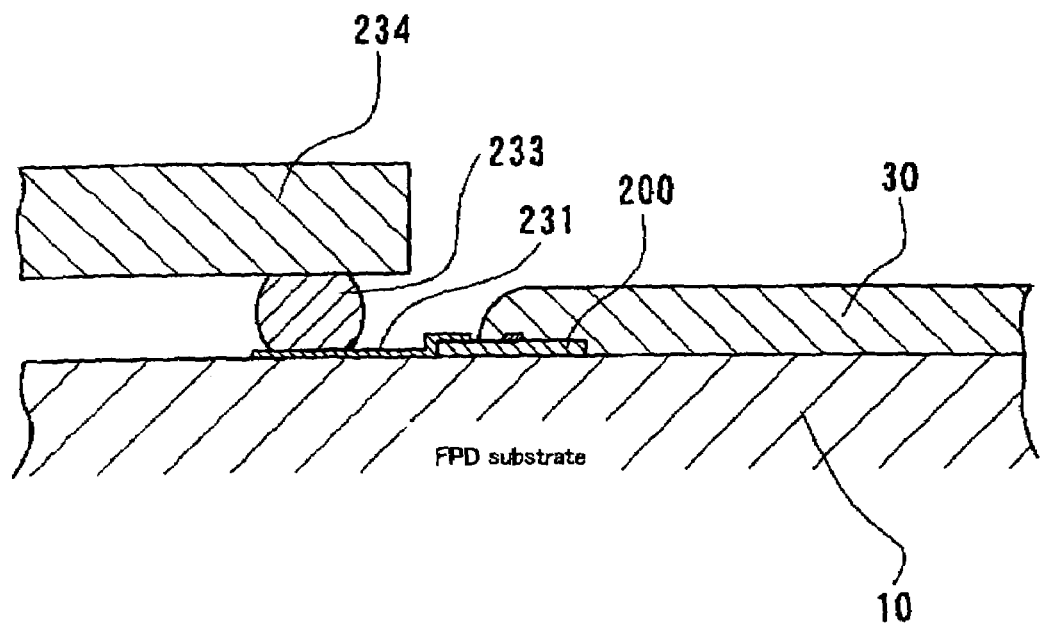
FIG. 4 is a sectional view of a significant part of the circuit according to the second exemplary embodiment of the present invention.
Figure 5:
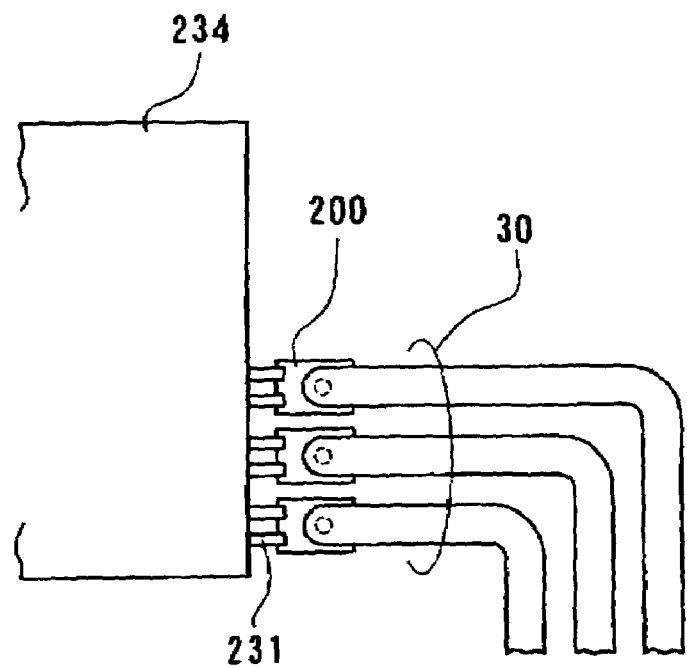
FIG. 5 is a plan view of a significant part of the circuit according to the second exemplary embodiment of the present invention.

Next, an application of the optical interconnection circuit between chips according to a second exemplary embodiment of the present invention is described below referring to FIGS. 3 to 5. In the present exemplary embodiment, an integrated circuit to time control and an integrated circuit to provide driving, of a flat panel display (FPD), are connected each other by using the optical wave-guide 30. FIG. 3 is a schematic circuit diagram showing the application of the optical interconnection circuit between chips according to the second exemplary embodiment of the present invention.

On the top surface of the substrate 10, which is an element of the flat panel display, an integrated circuit to time control (a timing controller) 222, a plurality of integrated circuits for driving a data line 223, a plurality of integrated circuits to provide driving a scan line 224, and a pixel matrix (a display surface) 225 are provided. Glass or plastic can be used for the substrate 10. The integrated circuit to time control 222, the integrated circuit to provide driving a data line 223, and the integrated circuit to drive a scan line 224 each include an integrated circuit chip. In addition, an input terminal of the integrated circuit to time control 222 is connected to an output terminal of a video source 221 (a personal computer, a video recorder, a tuner, and the like).

Furthermore, the optical wave-guide 30 here including a plurality of optical wave-guides is provided to connect the integrated circuit to time control 222 to the integrated circuit to drive a data line 223, and connect the integrated circuit to time control 222 to the integrated circuit to drive a scan line 224. A single of the optical wave-guide 30 is provided for each of the integrated circuit to drive a data line 223 and the integrated circuit to drive a scan line 224.

The integrated circuit to time control 222 includes light emitting elements, the number of which is the same as that of the optical wave-guide 30, namely, the same as the total number of the integrated circuit to drive a data line 223 and the integrated circuit to drive a scan line 224. The light emitting elements are output means of the integrated circuit to time control 222, and include a first micro tile element 21 equivalent to the micro tile element 200 having a light emitting function described above. The first micro tile element 21 includes, for example, a surface emitting laser (a VCSEL), or a DFB (distributed feedback) laser incorporating an electroabsorption modulator, a light emitting diode (LED), or the like.

The integrated circuit to drive a data line 223 and the integrated circuit to drive a scan line 224 each include a light receiving element. The light receiving element is an input device of the integrated circuit to drive a data line 223 or the integrated circuit to drive a scan line 224, and includes a second micro tile element 22 equivalent to the micro tile element 200 having a light receiving function described above. The second micro tile element 22 includes, for example, a photo diode or a photo transistor.

First, a video signal output from the video source 221 is input to the integrated circuit to time control 222. The video signal is processed by the integrated circuit to time control 222, and then is converted into an optical pulse signal by the first micro tile element 21. The optical pulse signal emitted from the first micro tile element 21 transmits in the optical wave-guide 30 to be converted into an electrical signal by the second micro tile element 22 so as to become an input signal to each of the integrated circuit to drive a data line 223 and the integrated circuit to drive a scan line 224. Each of the integrated circuit to drive a data line 223 and the integrated circuit for driving a scan line 224 is controlled by the input signal.

Furthermore, a data signal is output from the integrated circuit to drive a data line 223 to each of a plurality of data lines (not shown in the drawing) disposed on the pixel matrix 225. In addition, a scan signal is output from the integrated circuit to drive a scan line 224 to each of a plurality of scan lines (not shown in the drawing) disposed on the pixel matrix 225. Each pixel of the pixel matrix 225 is sequentially driven and controlled by the scan signal and data signal, and thereby an image is displayed on the pixel matrix 225.

The scan lines and the data lines disposed on the pixel matrix 225 may include an electrical wiring used in a related art flat panel display. Otherwise, these lines may include the optical wave-guide 30. In this case, the first micro tile element 21 having a light emitting function is preferably provided to an output part of the integrated circuit for driving a data line 223 and the integrated circuit for driving a scan line 224. In addition, the second micro tile element 22 having a light receiving function is preferably formed as a signal receiving means of each pixel, which receives a signal from each scan line and each data line.

According to the present exemplary embodiment, a datum can be transmitted at very high speed by an optical signal between the integrated circuit to time control 222 and the integrated circuit to drive a data line 223, and between the integrated circuit to time control 222 and the integrated circuit to drive a scan line 224, on the substrate 10 forming the flat panel display. Therefore, an increase in the size and quality of a screen of the flat panel display can be promoted.

Furthermore, according to the present exemplary embodiment, the optical wave-guide 30 can be easily connected to a light emitting element (the first micro tile element 21) and a light receiving element (the second micro tile element 22) without the need for a complicated structure or adjustment. In addition, since a video signal and the like is transmitted as an optical signal, an electromagnetic wave radiated from a screen (a flat panel display) can be greatly reduced, and thereby electromagnetic interference (EMI) can be greatly reduced or prevented. Furthermore, the optical wave-guide 30 may be disposed on a metal wiring pattern in piles.

Next, a structural example where an integrated circuit chip forming the integrated circuit to time control 222, the integrated circuit to drive a data line 223, and the integrated circuit to drive a scan line 224 is flip-chip mounted onto the substrate 10 in the present exemplary embodiment is described below. FIG. 4 is a sectional view showing a significant part of a structural example where the integrated circuit to time control and the like is flip-chip mounted. FIG. 5 is a plan view showing a significant part of the structural example shown in FIG. 4. The present structural example is formed by combining the method of the first exemplary embodiment with the second exemplary embodiment.

A flip-chip IC 234 is a circuit equivalent to the integrated circuit to time control 222, the integrated circuit to drive a data line 223, or the integrated circuit to drive a scan line 224 described above, and is an IC chip which is flip-chip mounted onto the substrate 10. A metal wiring (a bonding pad) 231 is provided on the substrate 10. A bump 233 is formed on the metal wiring 231. Furthermore, the flip-chip IC 234 is formed on the bump 233.

The micro tile element 200 that includes a plurality of micro tile elements, which are equivalent to the first micro tile element 21 having a light emitting function or the second micro tile element 22 having a light receiving function shown in FIG. 3, is disposed in the vicinity of the flip-chip IC 234. The micro tile element 200 is each covered by an end of the optical wave-guide 30. Furthermore, an input terminal or an output terminal of the flip-chip IC 234 is electrically connected to the micro tile element 200 through the bump 233 and the metal wiring 231.

This enables an input signal or an output signal, from or to the flip-chip IC 234, to be transmitted at very high speed via the optical wave-guide 30 and the like. As shown in FIG. 5, the metal wiring 231 that includes a plurality of metal wirings is provided in the vicinity of the flip-chip IC 234. To each of the metal wiring 231 the micro tile element 200 is provided. Moreover, to each of the micro tile element 200 the optical wave-guide 30 is provided. Consequently, optical parallel communications can be established.

In addition, in the first and the second exemplary embodiments, a surface and the like of the optical wave-guide 30 shown in FIG. 1 through FIG. 5 is preferably treated so as to prevent extraneous light from entering the optical wave-guide 30. This reduces or prevents extraneous light, such as natural light and a light in a room from entering the optical wave-guide 30. Furthermore, even when the optical wave-guide 30 that includes a plurality of optical wave-guides is disposed on the substrate 10 closely each other, transmitting light of one of the optical wave-guide 30 can be prevented from entering another.

In addition, in the first and the second exemplary embodiments, on the substrate 10, the micro tile element 200 having a light emitting function that includes a plurality of micro tile elements may be provided to a single of the optical wave-guide 30, and then the micro tile element 200 emits light to the optical wave-guide 30. The micro tile element 200 having a light emitting function including a plurality of micro tile elements emit lights having at least two kinds of wavelengths different from each other. This enables multiple kinds of optical signals to be simultaneously transmitted by a single of the optical wave-guide 30, and thereby the speed of signal transmission can be further increased, while a more compact signal transmission means can be provided.

(Optical Interconnection Circuit)

Details of an optical interconnection circuit which is an element of the optical interconnection circuit between chips of the first and the second exemplary embodiments are described below.

FIGS. 6A and 6B show an optical interconnection circuit according to the present exemplary embodiment. FIGS. 6A and 6B are a schematic sectional view and a schematic plan view, respectively. The optical interconnection circuit according to the present exemplary embodiment includes a substrate 10, a first micro tile element 21, and a second micro tile element 22, both of which are bonded to a surface of the substrate 10. The optical interconnection circuit also includes an optical wave-guide 30 including an optical wave-guide member formed on the surface of the substrate 10 so as to connect the first micro tile element 21 and the second micro tile element 22 each other. The first and the second micro tile elements 21 and 22 are the same as those of the first and the second exemplary embodiments. Transparent resin and sol-gel glass can be applied as the optical wave-guide member. Any materials, such as glass epoxy, ceramic, plastic, polyimide, silicon, and glass can be applied as the substrate 10.

The first micro tile element 21 and the second micro tile element 22 are semiconductor devices having the shape of a micro tile (a micro tile element). This micro tile element is, for example, a plate member whose thickness is twenty (20) μm or less, and the length and the width are from several dozen μm to several hundred μm. A method of manufacturing the micro tile element is described in detail below.

The first micro tile element 21 includes a light emitting part 21a having a light emitting function. The second micro tile element 22 includes a light receiving part 22b having a light receiving function. In addition, the optical wave-guide member forming the optical wave-guide 30 is formed to cover at least the light emitting part 21a of the first micro tile element 21 and the light receiving part 22b of the second micro tile element 22.

This structure allows light emitted from the light emitting part 21a of the first micro tile element 21 to be transmitted in the optical wave-guide 30, and then reach the light receiving part 22b of the second micro tile element 22. Namely, when the light emitting operation of the light emitting part 21a is controlled so as to emit an optical signal from the light emitting part 21a, the optical signal transmits in the optical wave-guide 30, and then the light receiving part 22b detects the optical signal transmitted in the optical wave-guide 30.

Furthermore, an optical signal emitted from the first micro tile element 21 transmits in the optical wave-guide 30 to not only enter the second micro tile element 22, but also passes over the second micro tile element 22. This enables an optical signal to be almost simultaneously sent from one of the first micro tile element 21 to the second micro tile element 22 that includes a plurality of micro tile elements. Making the thickness of the second micro tile element 22 be twenty (20) μm or less adequately reduces a level difference from the substrate, so that the optical wave-guide 30 can be continuously formed crossing over the level difference, as shown in FIGS. 6A and 6B. Even if the optical wave-guide 30 is continuously formed on a level difference part, the level difference is so small that transmission losses of light due to scattering and the like can be nearly neglected. Therefore, a special structure and an optical device to reduce the level difference are unnecessary on the level difference part. Thus, the optical interconnection circuit can be easily and manufactured at low cost. In addition, the thickness of the optical wave-guide member forming the optical wave-guide 30 can be made several dozen μm or less.

The first micro tile element 21 includes, for example, an LED, a VCSEL (a surface emitting laser), or a DFB laser incorporating an electroabsorption modulator. Although an LED has the simplest structure among the three and is easy to be manufactured as a light emitting device, its speed of modulating an optical signal is slow, which is about several hundred Mbps. Meanwhile, a VCSEL modulates an optical signal at very high speed, which is over ten (10) Gbps, and drives with low power consumption with a small threshold current and high light emission efficiency. Although the modulating speed of a DFB laser is about one (1) Gbps, which is slower than a surface emitting laser, a DFB laser emits laser light from an edge part of micro tile shape to a direction parallel to a flat plane of the substrate 10, namely a direction along the optical wave-guide 30. Therefore, it transmits an optical signal more efficiently than a surface emitting laser does.

The second micro tile element 22 includes, for example, a photodiode or a phototransistor. A PIN photodiode, an avalanche photodiode (APD), and an MSM photodiode can be selected as a photodiode depending on usage. Both optical sensitivity and response frequency of an APD are high. An MSM photodiode has a simple structure and is easy to be integrated with a transistor to provide amplifying.

Furthermore, a third micro tile element (not shown in the drawing) having a light receiving element can be stacked on the first micro tile element 21. This allows the third micro tile element to monitor the quantity of light emitted from the first micro tile element 21 to feed the value back to the first micro tile element 21 so as to enable an APC function to be equipped with the optical interconnection circuit, and thereby stable optical data transmission can be realized. Alternatively, an APC function may be incorporated in the first micro tile element 21. In addition, the second micro tile element 22 preferably includes a circuit which amplifies a detected signal and the like. This enables a device to be further enhanced in performance.

Furthermore, the first micro tile element 21 and the second micro tile element 22 are electrically connected to an integrated circuit formed on the substrate 10 or an electronic circuit (not shown in the drawing), such as a display circuit for an EL, a display circuit for a plasma display, and a display circuit for a liquid crystal. This enables a computer system including an integrated circuit to be improved in operation speed compared to a related art one, with keeping a compact size. In addition, a scan signal of a flat display provided on the substrate 10 can be transmitted at high speed by the optical interconnection circuit of the present exemplary embodiment, and thereby an increase in the size and the quality of a screen of a flat display device can be promoted.

Although a single of the first micro tile element 21 and a single of the second micro tile element 22 are bonded to a single of the optical wave-guide 30 in FIGS. 6A and 6B, the second micro tile element 22 may include a plurality of micro tile elements. In this case, an optical signal sent from a single of the first micro tile element 21 (a light emitting element) transmits in a single of the optical wave-guide 30, and can be simultaneously detected by the second micro tile element 22 here including a plurality of micro tile elements. This is the same as a one-to-many bus line.

Furthermore, both of the first micro tile element 21 and the second micro tile element 22 may include a plurality of micro tile elements. Wavelengths of light emitted from each of the first micro tile element 21 may be different from each other. In addition, each of the second micro tile element 22 preferably acts as a light receiving means having a wavelength selecting function, by which received light is selected depending on a wavelength of light emitted from at least a single of the first micro tile element 21. This enables a plurality of optical signals output from the first micro tile element 21 here including a plurality of micro tile elements to simultaneously transmit through a single of the optical wave-guide 30 and then to be detected by the second micro tile element 22 here including a plurality of micro tile elements. Therefore, a bus capable of sending and receiving a plurality of optical signals in parallel can be easily formed.

Furthermore, although the optical wave-guide 30 is formed in a straight line manner in FIG. 6, it can be formed in a curved manner or be branched into plural lines. In addition, it may be formed in a loop manner. Moreover, it may be formed in a sheet manner to cover a plurality of tile elements. Of course, multiple groups of the first micro tile element 21, the second micro tile element 22, and the optical wave-guide 30 may be formed on a surface of a single of the substrate 10. Additionally, the first micro tile element 21, the second micro tile element 22, and the optical wave-guide 30 may be formed on both front and back sides of the substrate 10.

Figure 7:
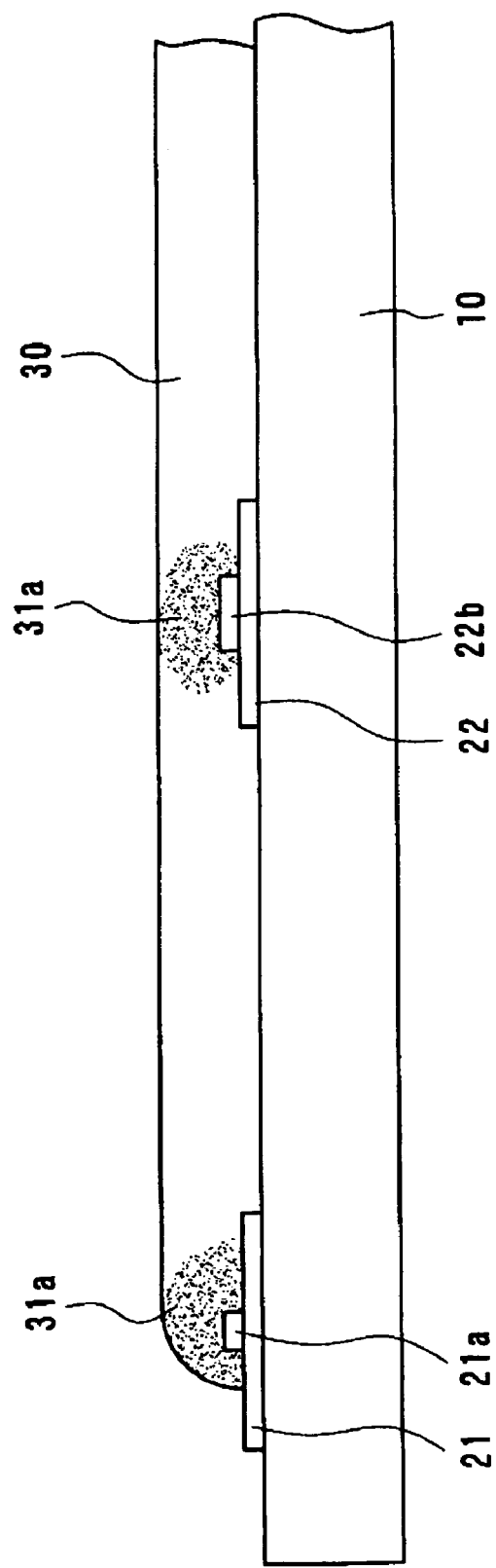
FIG. 7 is a side view showing an exemplary modification of the circuit element according to the exemplary embodiment of the present invention.

Exemplary modifications of the optical interconnection circuit according to the present exemplary embodiment are described below referring to FIG. 7 through FIG. 10B. The present exemplary embodiment is different from the structure shown in FIGS. 6A and 6B in that a light scattering mechanism scattering light is provided to the optical wave-guide 30 in the vicinity of the first micro tile element 21 and the second micro tile element 22. FIG. 7 is a schematic side view showing a modification of the optical interconnection circuit according to the present exemplary embodiment.

In the optical interconnection circuit according to this modification, a light scattering particle forming a light scattering mechanism 31a is dispersed in the vicinity of the first micro tile element 21 and the second micro tile element 22 on the optical wave-guide member forming the optical wave-guide 30. For example, a silica particle, a glass particle, a metal particle, or the like are used as the light scattering particle. The optical wave-guide 30 including the light scattering mechanism 31a is formed by using a droplet ejecting method, in which a droplet is ejected from, for example, a dispenser and an ink jet nozzle. Specifically, not only ejecting a liquid optical wave-guide member (e.g., a member made of resin) from an ink jet nozzle and the like onto a predetermined part, but also ejecting the liquid optical wave-guide member including the light scattering particle from another ink jet nozzle and the like to a predetermined part forms the optical wave-guide 30 having the light scattering mechanism 31a.

Furthermore, sol-gel glass as well as resin can be used as a material of the optical wave-guide 30. A method of manufacturing the sol-gel glass includes coating a predetermined part with a solvent, which is hydrolyzed by adding acid to metal alkoxide, and applying energy, such as heat thereto to vitrify it.

Figure 8:
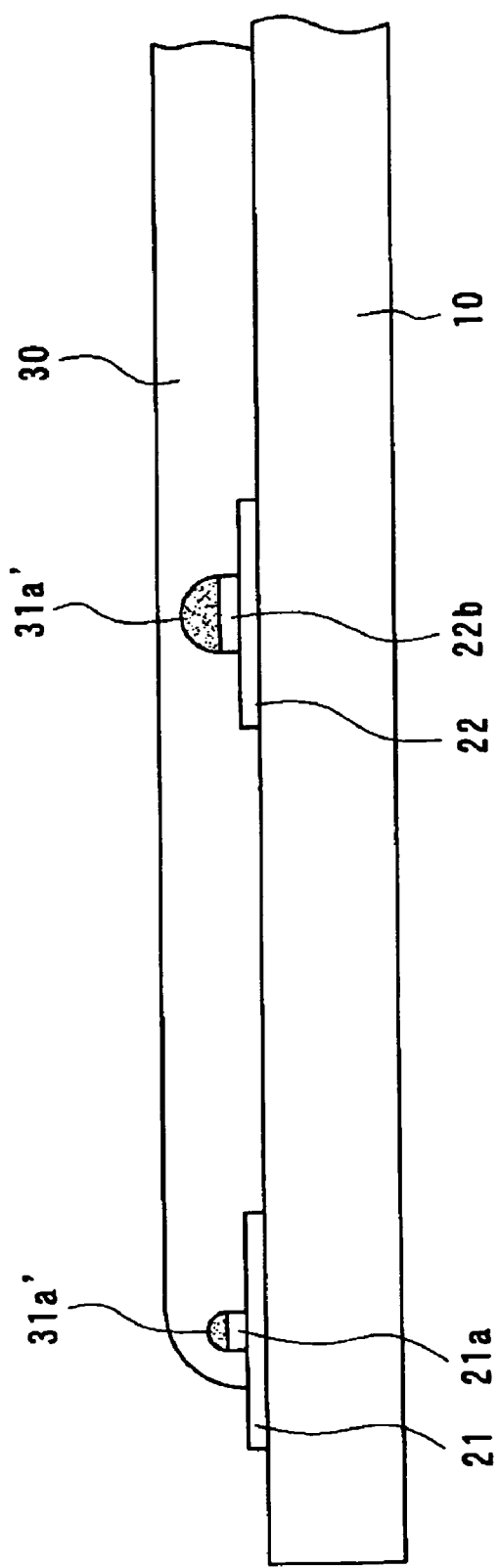
FIG. 8 is a side view showing an exemplary modification of the circuit element according to the exemplary embodiment of the present invention.

FIG. 8 is a schematic side view showing a modification of the optical interconnection circuit according to the present exemplary embodiment. A light scattering mechanism 31a' of the optical interconnection circuit according to this modification is a dome-shaped light scattering mechanism made of resin or glass, into which the light scattering particle is dispersed, formed into the shape of a dome. The optical wave-guide 30 is formed to cover the light scattering mechanism 31a' (the dome-shaped light scattering mechanism). Since the size and the shape of the light scattering mechanism 31a' are easier to be controlled than those of the light scattering mechanism 31a shown in FIG. 7, optical coupling efficiency between the optical wave-guide 30 and the first micro tile element 21, or between the optical wave-guide 30 and the second micro tile element 22 can be easily controlled.

A method of manufacturing the light scattering mechanism 31a' is described below. First, with an ink-jet method or a dispenser, liquid resin including the light scattering particle, a solvent hydrolyzed by adding acid to metal alkoxide such as a silicate ethyl, or the like is applied to a predetermined part of the substrate 10 in a dome manner. Next, such solvent is cured or vitrified by applying energy such as heat to the applied part. Thus, the light scattering mechanism 31a' of a dome shape is formed on the first micro tile element 21 or the second micro tile element 22. Then, the optical wave-guide 30 of line-shaped is formed by transparent resin or sol-gel glass to cover the light scattering mechanism 31a'.

Figure 9:
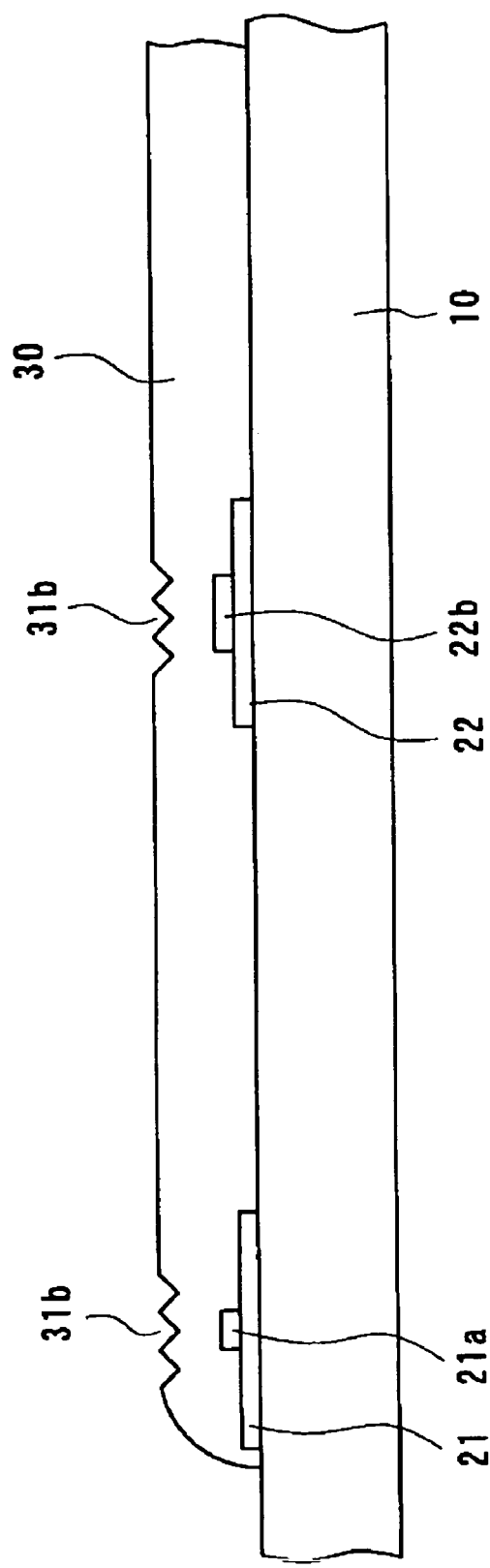
FIG. 9 is a side view showing an exemplary modification of the circuit element according to the exemplary embodiment of the present invention.

FIG. 9 is a schematic side view showing a modification of the optical interconnection circuit according to the present exemplary embodiment. A light scattering mechanism 31b of the optical interconnection circuit according to this modification has a convex-concave pattern on a surface of the optical wave-guide member forming the optical wave-guide 30. The light scattering mechanism 31b is also provided in the vicinity of the first micro tile element 21 and the second micro tile element 22. The convex-concave pattern forming the light scattering mechanism 31b is formed by embossing, stamper transferring, or the like.

Figure 10A:
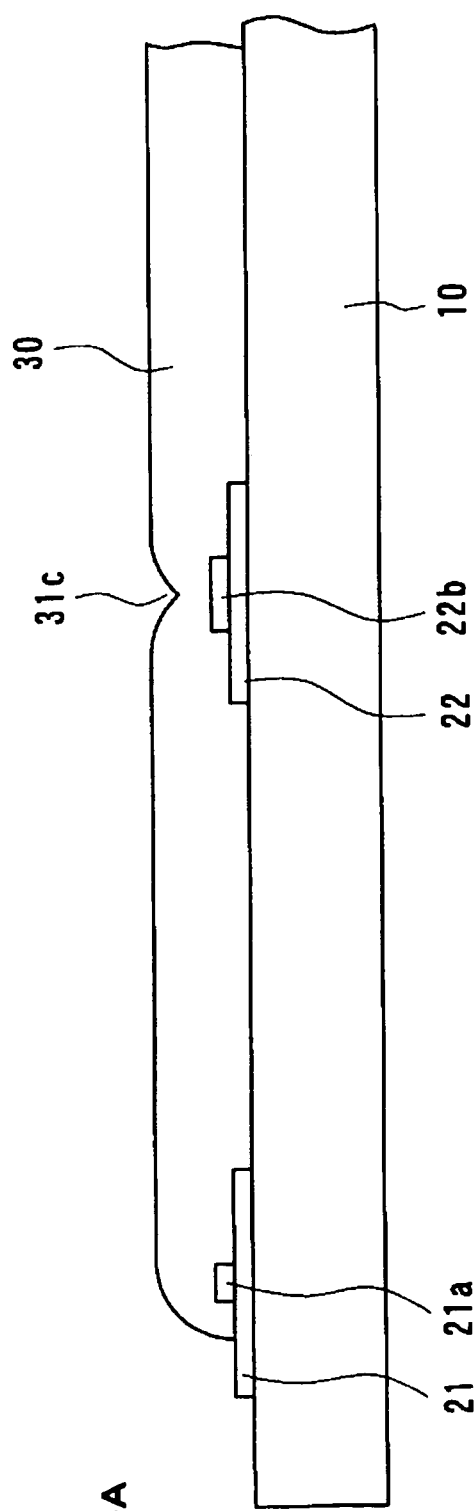
FIGS. 10A and 10B are side views showing an exemplary modification of the circuit element according to the exemplary embodiment of the present invention.
Figure 10B:
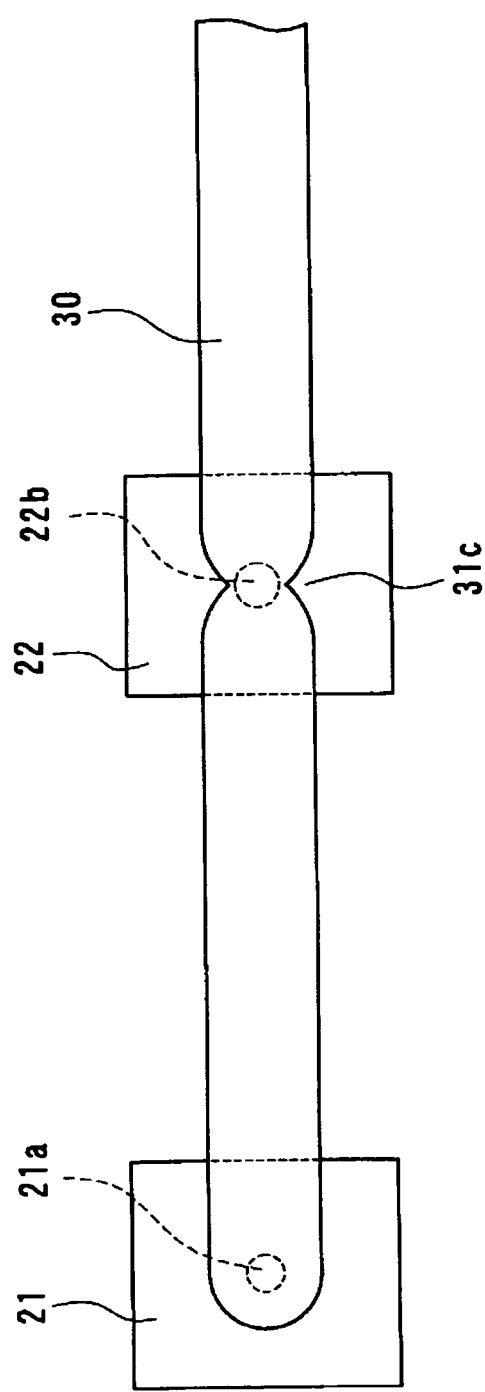

FIGS. 10A and 10B show a modification of the optical interconnection circuit according to the present exemplary embodiment. FIGS. 10A and 10B are a schematic side view and a schematic plan view, respectively. As regards a light scattering mechanism 31c of the optical interconnection circuit according to this modification, the width and the height of the line-shaped optical wave-guide member forming the optical wave-guide 30 are changed. Namely, in the optical wave-guide 30, the width and the height of the optical wave-guide member in the vicinity of the light receiving part 22b of the second micro tile element 22 are decreased.

A method of manufacturing the optical wave-guide 30 including the light scattering mechanism 31c is described below. First, the first micro tile element 21 and the second micro tile element 22 are bonded to a desired part of a surface of the substrate 10. Next, a lyophobic treatment is performed for the surface of the substrate 10, the first micro tile element 21, and the second micro tile element 22. Then, a lyophilic treatment is performed for an area where the optical wave-guide 30 is provided on the lyophobic-treated surface. The lyophilic-treated area has a line-shaped pattern, where line width is decreased in the vicinity of the light receiving part 22b of the second micro tile element 22. The lyophilic treatment is performed by, for example, irradiating ultraviolet rays.

Next, a liquid optical wave-guide member is dropped from an ink jet nozzle and the like onto the lyophilic-treated area. Then, such a dropped optical wave-guide member spreads in the lyophilic-treated area, while it is repelled from the lyophobic-treated area. In addition, surface tension of the dropped material also acts on. Therefore, the optical wave-guide member has a form whose line width is decreased in the vicinity of the light receiving part 22b as shown in FIGS. 10A and 10B.

As mentioned above, forming the light scattering mechanisms 31a, 31b, and 31c in the vicinity of the first micro tile element 21 on the optical wave-guide 30 allows an optical signal emitted from the first micro tile element 21 to be scattered at the light scattering mechanisms 31a, 31b, and 31c. Thus, the optical signal is efficiently transmitted to throughout the optical wave-guide. In addition, forming the light scattering mechanisms 31a, 31b, and 31c in the vicinity of the second micro tile element 22 allows an optical signal transmitted in the optical wave-guide 30 to be scattered in the vicinity of the second micro tile element 22. This enables the optical signal to efficiently enter the second micro tile element 22.

Other modifications of the optical interconnection circuit according to the present exemplary embodiment are described referring to FIG. 11A through FIG. 13B. The present exemplary embodiment is different from the above exemplary embodiment in that a light reflecting mechanism which reflects light is provided in the vicinity of the first micro tile element 21 and the second micro tile element 22 on the optical wave-guide 30, or on an end of the optical wave-guide 30. FIGS. 11A and 11B show a modification of the optical interconnection circuit according to the present exemplary embodiment. FIGS. 11A and 11B are a schematic side view and a schematic plan view, respectively.

For example, light reflecting mechanisms 32a and 32b are provided by forming a metal film on a surface of the optical wave-guide member forming the optical wave-guide 30. In addition, the light reflecting mechanisms 32a and 32b may be provided by applying a coating material including a metal fine particle to a surface of the optical wave-guide member forming the optical wave-guide 30. A fine particle of silver, aluminum, magnesium, copper, nickel, titanium, chrome, and zinc can be applied as the metal fine particle. Forming the metal film constituting the light reflecting mechanisms 32a and 32b and applying the coating material including the metal fine particle may be performed by ejecting the coating material and the like from an ink jet nozzle and the like. Furthermore, the light reflecting mechanism 32a or 32b may be formed on all over the optical wave-guide 30.

The above-mentioned structure allows an optical signal emitted from the first micro tile element 21 to be reflected to a direction along the optical wave-guide 30 by the light scattering mechanism 32a, and allows a part of the optical signal to be reflected to the second micro tile element 22 by the light scattering mechanism 32b. Therefore, according to the present exemplary embodiment, an optical signal can be efficiently transmitted.

FIGS. 12A and 12B show a modification of the optical interconnection circuit according to the present exemplary embodiment. FIGS. 12A and 12B are a schematic side view and a schematic plan view, respectively. As regards a light reflecting mechanism 32c of the optical interconnection circuit according to this modification, a reflection plate having a reflection plane is attached to an end of the optical wave-guide 30. Here, the reflection plane of the light reflecting mechanism 32c is formed at, for example, a 45-degree angle to a surface of the substrate 10.

Furthermore, two parallel optical wave-guides 30a and 30b are provided in the optical interconnection circuit according to this modification. In addition, the light reflecting mechanism 32c is provided on an end of the optical wave-guides 30a and 30b, and acts as a reflection plate common to the optical wave-guides 30a and 30b. Thus, each optical signal emitted from two of the first micro tile element 21 is reflected to a direction along the optical wave-guides 30a and 30b by the optical wave-guide 32c. Therefore, according to the present exemplary embodiment, an optical signal can be efficiently transmitted, while the optical interconnection circuit can be efficiently manufactured.

Although the light reflecting mechanism 32c common to the optical wave-guides 30a and 30b is provided in the embodiment shown in FIGS. 12A and 12B, the light reflecting mechanism 32c may be common to three or more optical wave-guides.

FIGS. 13A and 13B show a modification of the optical interconnection circuit according to the present embodiment. FIGS. 13A and 13B are a schematic side view and a schematic plan view, respectively. Light scattering mechanisms 32d and 32e of the optical interconnection circuit according to this modification are grated plate-shaped optical parts (grated parts). The light scattering mechanisms 32d and 32e are formed on the optical wave-guide 30 to cover the first micro tile element 21 and the second micro tile element 22, respectively.

In a case where an interval between the optical wave-guides 30a and 30b is comparatively large, the light scattering mechanism 32e is separately attached to each of the optical wave-guides 30a and 30b, as shown in FIGS. 13A and 13B. In another case where the optical wave-guides 30a and 30b are closely disposed in almost parallel each other, the light scattering mechanism 32d common to the optical wave-guides 30a and 30b may be attached as shown in FIGS. 13A and 13B.

The above-mentioned light scattering mechanisms and the light reflecting mechanisms shown in FIG. 7 through FIG. 13B work more effectively when they are used in combination.

(Method of Manufacturing)

Next, a method of manufacturing the optical wave-guide 30 in the optical interconnection circuit according to the above-mentioned embodiment will be described referring to FIG. 14A through FIG. 17B. FIGS. 14A and 14B are schematic side views showing the method of manufacturing the optical wave-guide 30.

First, the first and the second micro tile elements are bonded to a top surface of the substrate 10 before a manufacturing process of the optical wave-guide 30. Next, all over the top surface of the substrate 10, the first micro tile element, and the second micro tile element (not shown in the drawing) are coated with a liquid light curable resin 30c as shown in FIG. 14A. This coating is performed by a spin coating method, a roll coating method, a spray coating method, and the like.

Subsequently, the liquid light curable resin 30c is irradiated with ultraviolet rays (UV) through a mask of a desired pattern. This allows only a desired area of the liquid light curable resin 30c to be cured so as to perform patterning. Furthermore, an optical wave-guide 30d including the cured optical wave-guide member is formed by removing non-cured resin by cleaning and the like as shown in FIG. 14B.

FIGS. 15A and 15B are schematic side views showing one of other examples of the method of manufacturing the optical wave-guide 30. First, the first and the second micro tile elements are bonded to a top surface of the substrate 10 before the manufacturing process of the optical wave-guide 30. Next, a resin 30e is coated to be cured on all over the top surface of the substrate 10, the first micro tile element, and the second micro tile element (not shown in the drawing) as shown in FIG. 15A. This coating is performed by a spin coating method, a roll coating method, a spray coating method, and the like. Subsequently, a resist mask 41 is formed on a desired area of the resin 30e. The area on which the resist mask 41 is formed is the same as the area on which the optical wave-guide 30 is formed.

Then, as shown in FIG. 15B, dry or wet etching is performed for all over the substrate 10 through the resist mask 41 so as to remove the resin 30e not covered by the resist mask 41. Performing such photolithographic patterning followed by removing the resist mask 41 forms an optical wave-guide 30f including an optical wave-guide member.

FIGS. 16A and 16B are schematic side views showing one of other examples of the method of manufacturing the optical wave-guide 30. First, the first and the second micro tile elements are bonded to a top surface of the substrate 10 before the manufacturing process of the optical wave-guide 30. Next, a lyophobic treatment is performed to form a lyophobic surface 51 on all over the top surface of the substrate 10, the first micro tile element, and the second micro tile element (not shown in the drawing).

Then, as shown in FIG. 16A, a lyophilic surface 52 of a desired pattern is formed in the lyophobic surface 51 by, for example, irradiating a desired pattern area in the lyophobic surface 51 with ultraviolet rays. Subsequently, a liquid optical wave-guide member 30g is dropped from an inkjet nozzle, a dispenser, or the like to the lyophilic surface 52, as shown in FIG. 16B. Transparent resin or sol-gel glass is used as the optical wave-guide member 30g. Furthermore, an optical wave-guide 30h including the optical wave-guide member is formed by curing the optical wave-guide member 30g dropped to the substrate 10.

In a case where the optical wave-guide 30h is formed by sol-gel glass, a solvent hydrolyzed by adding acid to metal alkoxide and the like is dropped from an ink jet nozzle, a dispenser, or the like to the lyophilic surface 52. Then, the optical wave-guide 30h is formed by applying energy such as heat to the dropped solvent to vitrify it.

FIGS. 17A and 17B are schematic side views showing one of other examples of the method of manufacturing the optical wave-guide 30. First, the first and the second micro tile elements are bonded to a top surface of the substrate 10 before the manufacturing process of the optical wave-guide 30. Next, a liquid resin 30i is coated to cover an area on which the optical wave-guide 30 is provided, on the top surfaces of the substrate 10, the first micro tile element, and the second micro tile element as shown in FIG. 17A.

Next, a stamper 51, which is a mold having a pattern shape 52 of the optical wave-guide 30, is pressed on a surface of the substrate 10 from above the substrate 10. Then, the stamper 51 is lifted up from the surface of the substrate 10 as shown in FIG. 17B. This process forms an optical wave-guide 30j including the optical wave-guide member of a desired pattern on the substrate 10 by a pattern transferring method using the stamper 51.

The following methods as well as the above methods shown in FIG. 14A through FIG. 17B may be used to manufacture the optical wave-guide 30. The optical wave-guide member forming the optical wave-guide 30 may be formed by using, for example, a printing method such as a screen printing method or an offset printing method. Alternatively, the optical wave-guide member forming the optical wave-guide 30 may be formed by using a slit coating method, in which liquid resin is ejected from a slit-shaped gap. As a slit coating method, a desired member such as resin may be applied to the substrate 10 in a way utilizing a capillary phenomenon.

(Method of Manufacturing a Micro Tile Element)

A method of manufacturing the micro tile element forming the first micro tile element 21 and the second micro tile element 22 is described below referring to FIG. 18 through FIG. 27. Although a compound semiconductor device (a compound semiconductor element) as the micro tile element is bonded to a silicon LSI chip being a substrate in the following description of the method of manufacturing, the present invention can be applied to any kinds of semiconductor devices and LSI chips. Although a "semiconductor substrate" in the present exemplary embodiment means a substance including a semiconductor material, the shape of the substrate is not limited to the shape of a plate, and the "semiconductor substrate" includes a substrate of any shape if only it includes a semiconductor material.

<First Process>

Figure 18:
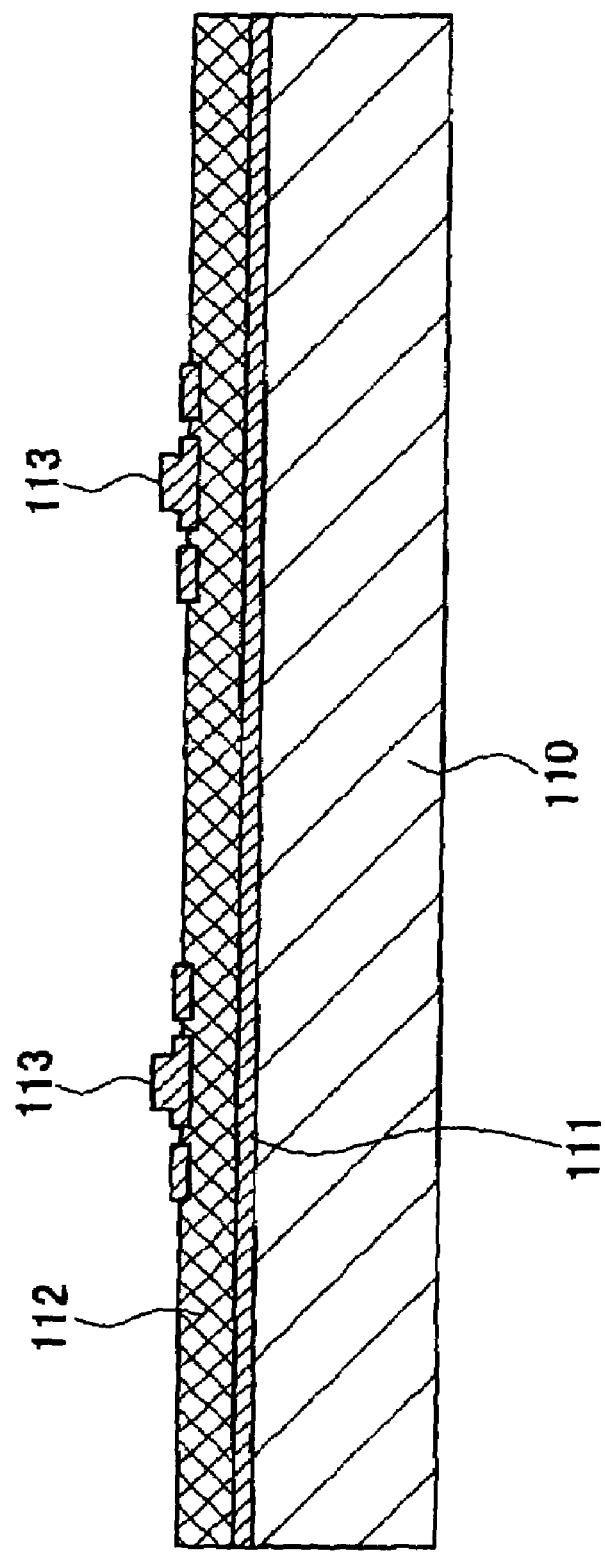
FIG. 18 is a schematic sectional view showing a first process of a method of manufacturing a micro tile element.

FIG. 18 is a schematic sectional view showing a first process of the method of manufacturing the micro tile element. In FIG. 18, a substrate 110 is a semiconductor substrate, and is, for example, a gallium arsenide compound semiconductor substrate. A sacrificial layer 111 is formed on a top layer of the substrate 110. The sacrificial layer 111 includes aluminum arsenide (AlAs), and is a layer of which the thickness is, for example, several hundred nm.

For example, a functional layer 112 is formed on the sacrificial layer 111. The thickness of the functional layer 112 is, for example, from one (1) μm to ten (twenty) (10 (20)) μm. In addition, a semiconductor device (a semiconductor element) 113 is formed on the functional layer 112. The semiconductor device 113 includes, for example, an LED, a surface emitting laser (a VCSEL), a photo diode (PD), a DFB laser, and the like. The semiconductor device 113 of any of these is an element formed by depositing multiple epitaxial layers on the substrate 110. Furthermore, an electrode is also formed on each of the semiconductor device 113 to perform an operation test.

<Second Process>

Figure 19:
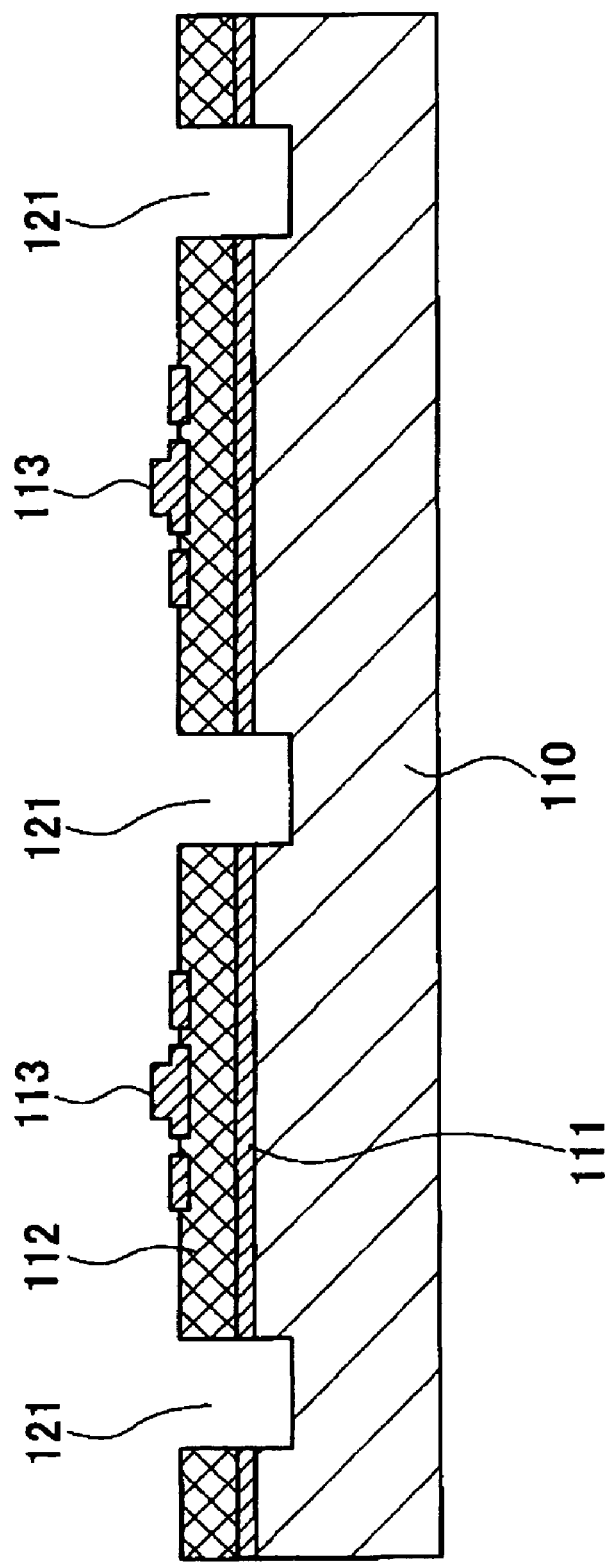
FIG. 19 is a schematic sectional view showing a second process of the method of manufacturing the micro tile element.

FIG. 19 is a schematic sectional view showing a second process of the method of manufacturing the micro tile element. In the present process, an isolation trench 121 is formed to isolate each of the semiconductor devices 113. The isolation trench 121 is a trench having a depth to reach at least the sacrificial layer 111. For example, both the width and the depth of the isolation trench are from ten (10) μm to several hundred μm. In addition, the isolation trench 121 is a trench spreading without a dead-end to flow a selective etchant described below. Furthermore, the isolation trench 121 is preferably formed in a lattice manner as a grid.

In addition, making an interval between each of the isolation trench 121 be from several dozen μm to several hundred μm makes the size of the semiconductor device 113 isolated and defined by the isolation trench 121 be from several dozen μm square to several hundred μm square. A photolithography method and a dry or wet etching method are used to form the isolation trench 121. Alternatively, the isolation trench 121 may be formed by using a dicer of a U-shaped trench within a scope where a crack is not caused in a substrate.

<Third Process>

Figure 20:
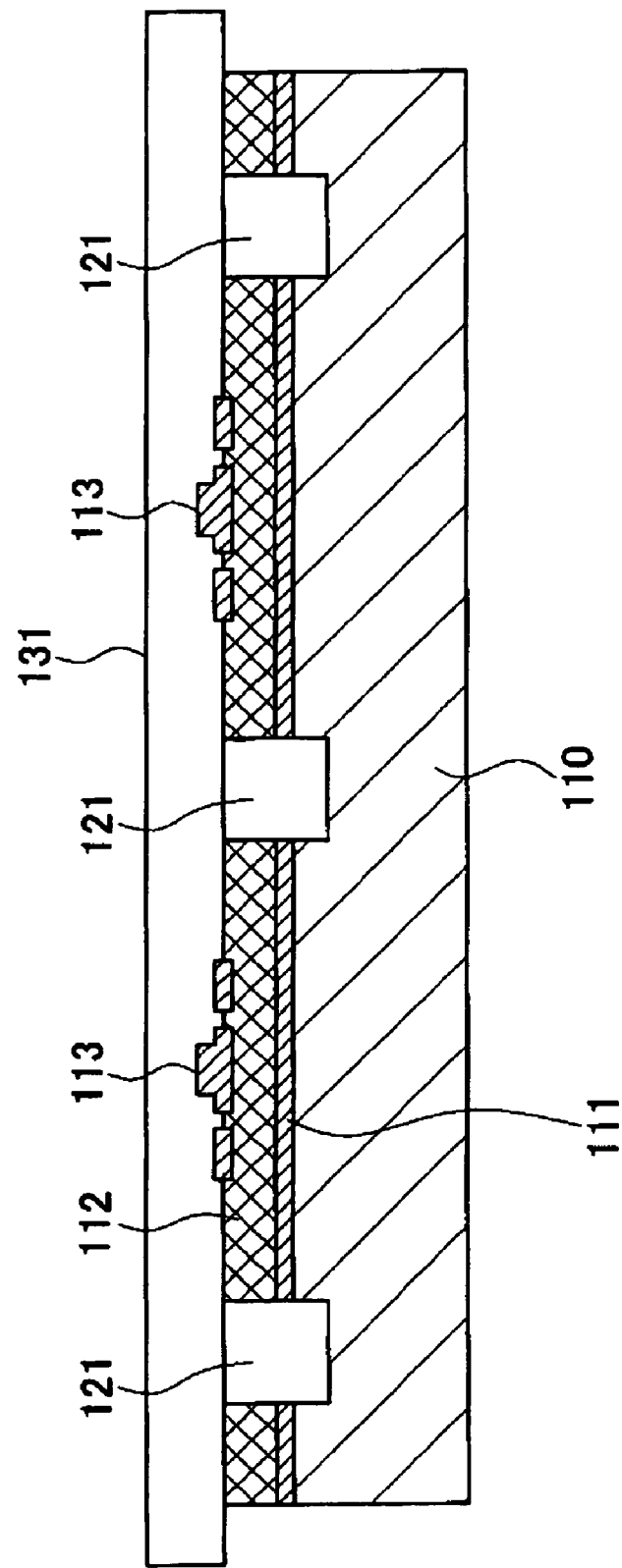
FIG. 20 is a schematic sectional view showing a third process of the method of manufacturing the micro tile element.

FIG. 20 is a schematic sectional view showing a third process of the method of manufacturing the micro tile element. In the present process, an intermediate transfer film 131 is attached to a surface of the substrate 110 (on the semiconductor device 113 side). The intermediate transfer film 131 is a flexible belt-shaped film of which surface is coated with an adhesive.

<Fourth Process>

Figure 21:
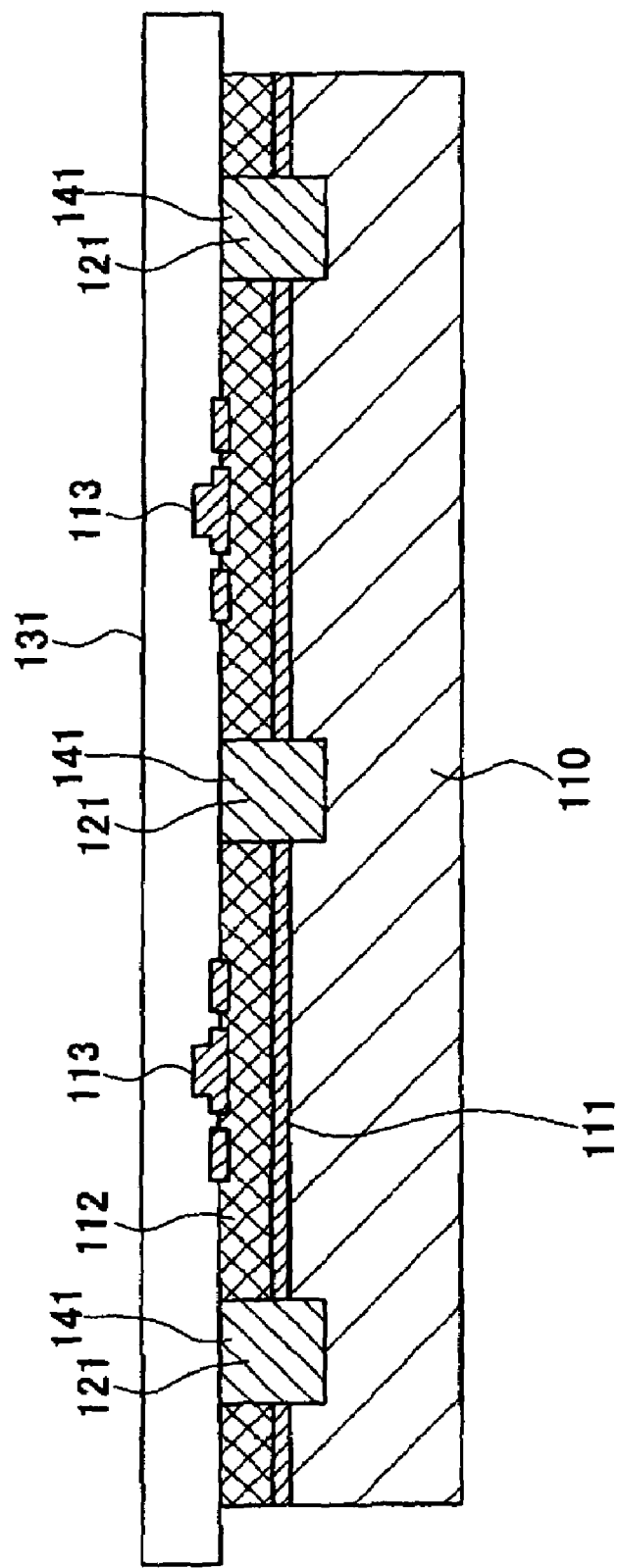
FIG. 21 is a schematic sectional view showing a fourth process of the method of manufacturing the micro tile element.

FIG. 21 is a schematic sectional view showing a fourth process of the method of manufacturing the micro tile element. In the present process, a selective etchant 141 is filled into the isolation trench 121. A hydrochloric acid of low concentration, which is highly selective to aluminum and arsenic, is used as the selective etchant 141 in order to selectively etch the sacrificial layer 111.

<Fifth Process>

Figure 22:
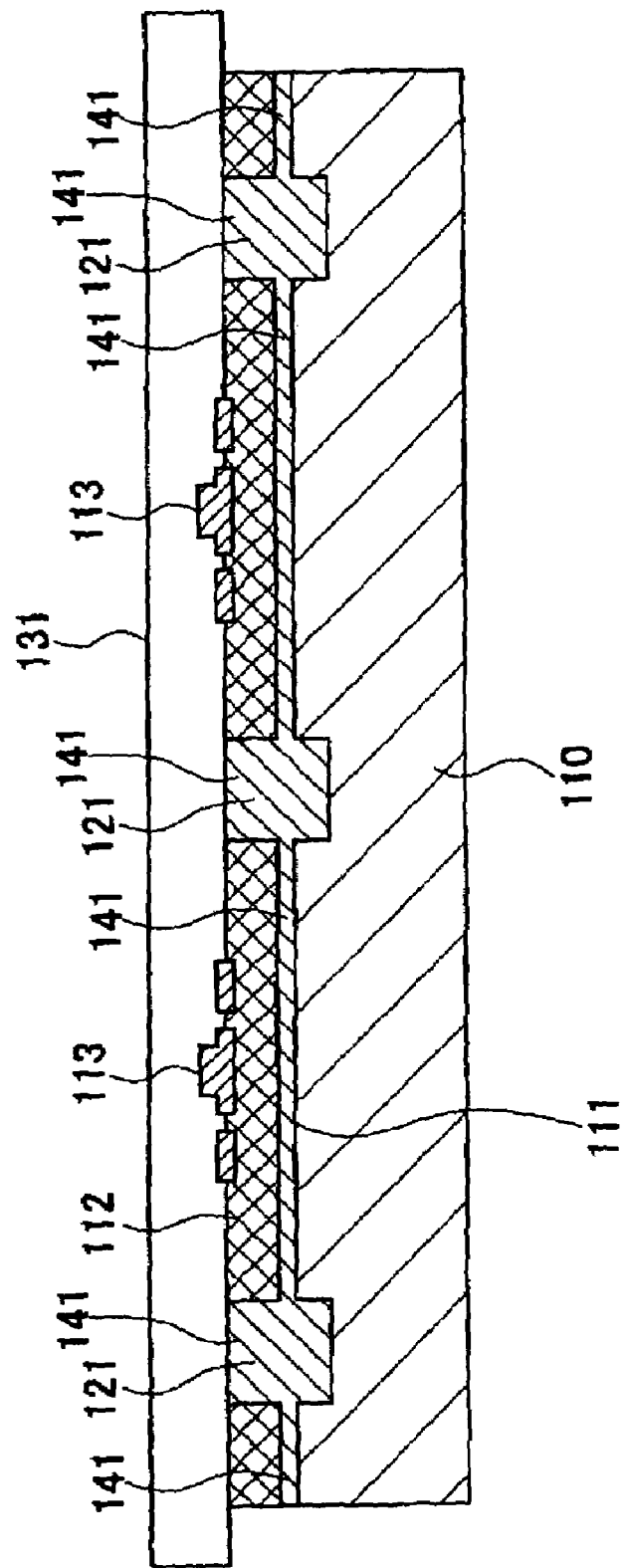
FIG. 22 is a schematic sectional view showing a fifth process of the method of manufacturing the micro tile element.

FIG. 22 is a schematic sectional view showing a fifth process of the method of manufacturing the micro tile element. In the present process, when a predetermined time passes after filling the selective etchant 141 into the isolation trench 121 in the fourth process, all of sacrificial layer 111 is selectively etched so as to be removed from the substrate 110.

<Sixth Process>

Figure 23:
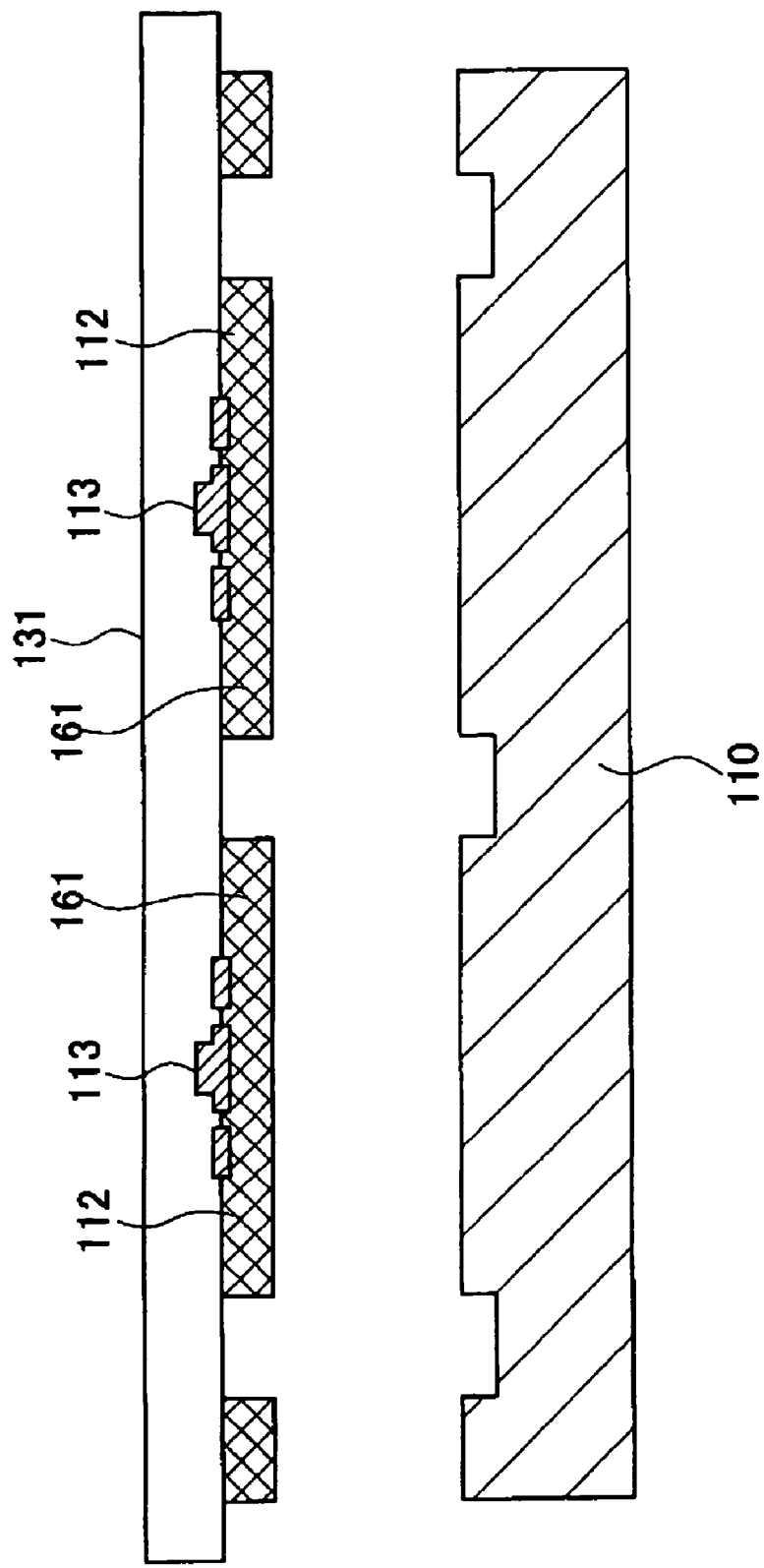
FIG. 23 is a schematic sectional view showing a sixth process of the method of manufacturing the micro tile element.

FIG. 23 is a schematic sectional view showing a sixth process of the method of manufacturing the micro tile element. When all of sacrificial layer 111 is etched in the fifth process, the functional layer 112 is separated from the substrate 110. Then, separating the intermediate transfer film 131 from the substrate 110 makes the functional layer 112 attached to the intermediate transfer film 131 be separated from the substrate 110.

Consequently, forming the isolation trench 121 and etching the sacrificial layer 111 allows the functional layer 112, on which the semiconductor device 113 is formed, to be isolated so as to become a semiconductor element (a "micro tile element" in the above exemplary embodiment) of a predetermined shape (for example, the shape of a micro tile) and be attached to and retained on the intermediate transfer film 131. It is preferable that the thickness of the functional layer is, for example, from one (1) μm to eight (8) μm, and the size (the length and the width) thereof is, for example, from several dozen μm to several hundred μm.

<Seventh Process>

Figure 24:
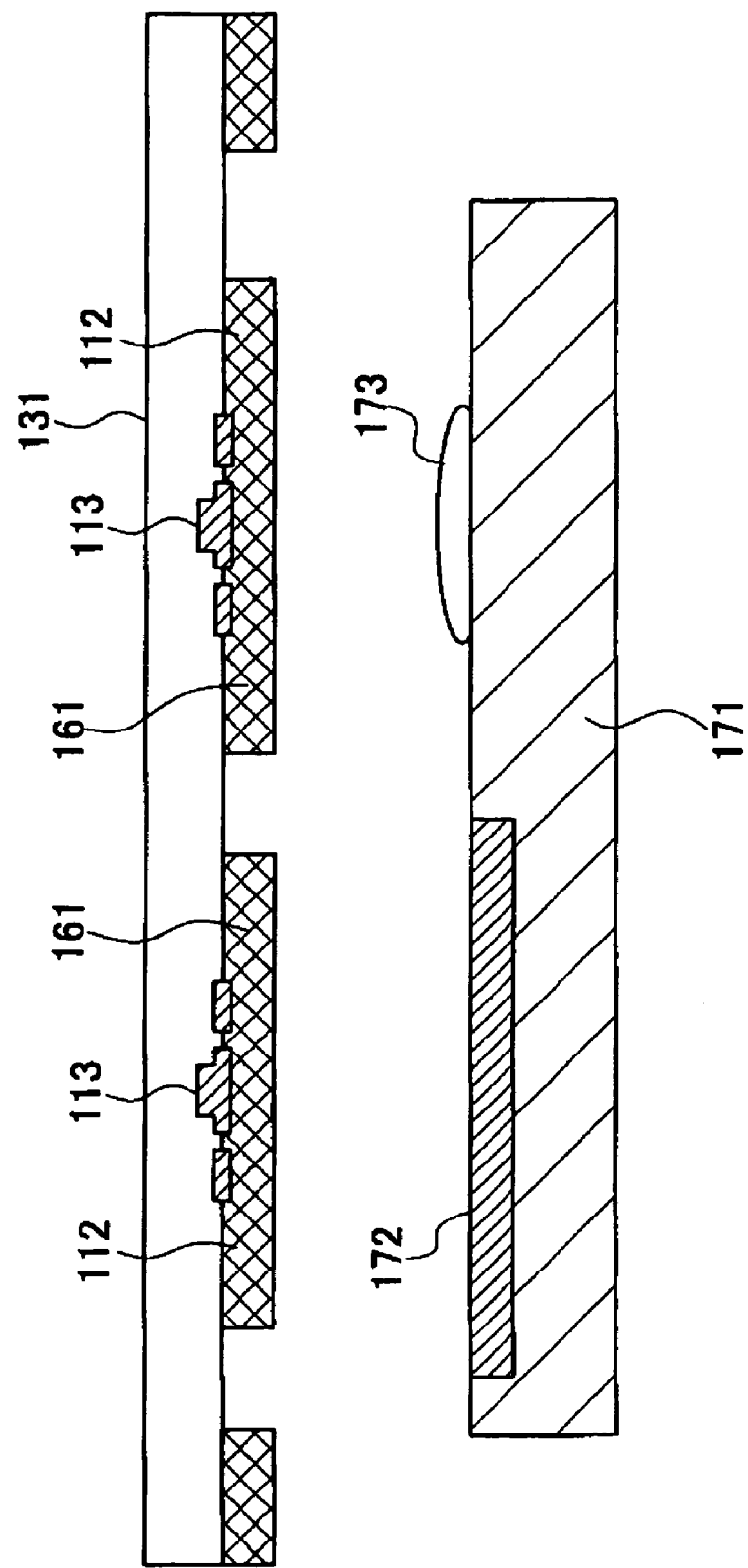
FIG. 24 is a schematic sectional view showing a seventh process of the method of manufacturing the micro tile element.

FIG. 24 is a schematic sectional view showing a seventh process of the method of manufacturing the micro tile element. In the present process, a micro tile element 161 is aligned with a desired position of a final substrate 171 by moving the intermediate transfer film 131 (to which the micro tile element 161 is attached). The final substrate 171 is made of, for example, a silicon semiconductor (the substrate 10 of FIG. 1) and includes an LSI area 172. In addition, the desired position of the final substrate 171 is coated with an adhesive 173 for bonding the micro tile element 161.

<Eighth Process>

Figure 25:
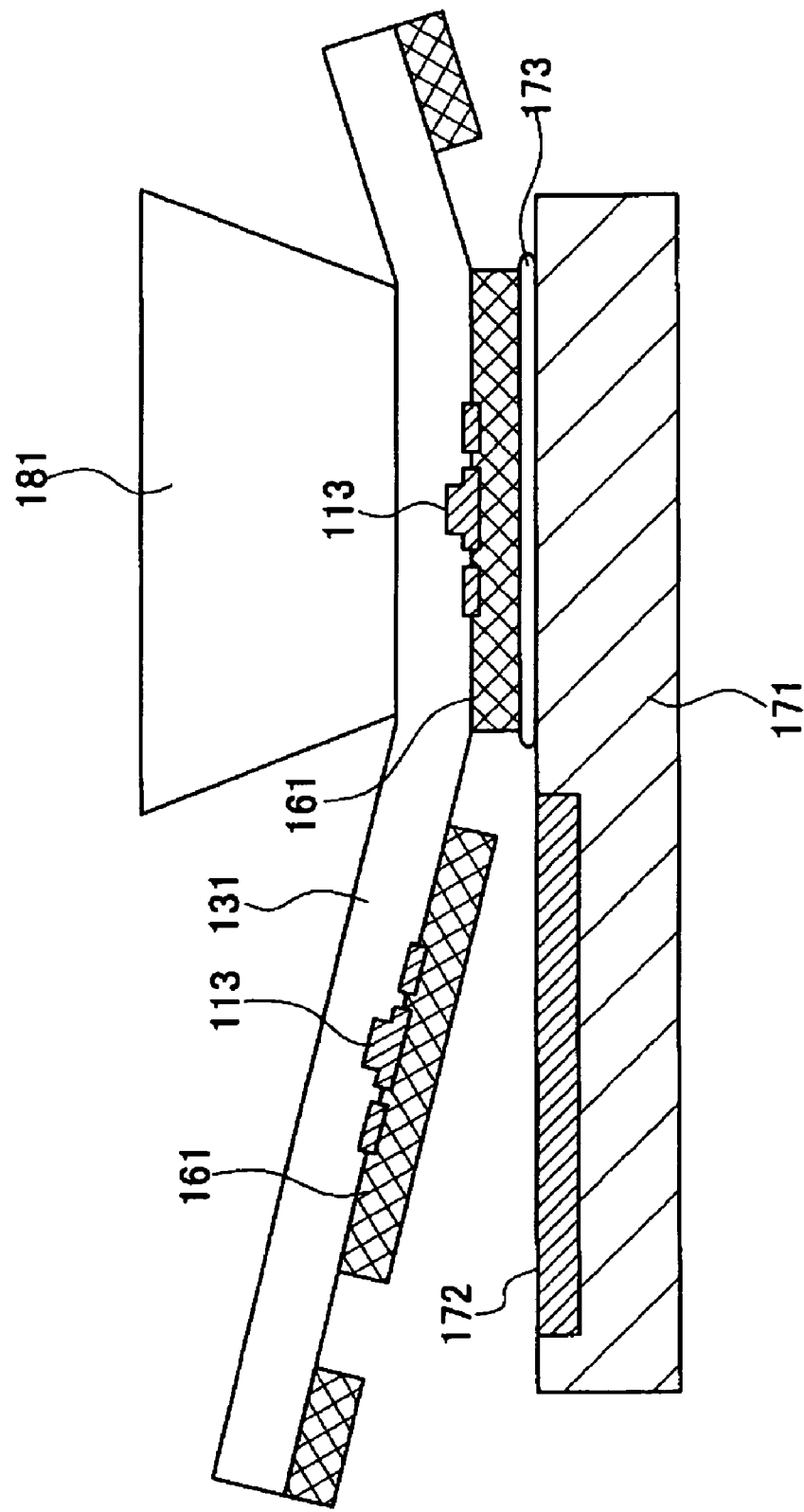
FIG. 25 is a schematic sectional view showing an eighth process of the method of manufacturing the micro tile element.

FIG. 25 is a schematic sectional view showing an eighth process of the method of manufacturing the micro tile element. In the present process, the micro tile element 161 aligned with the desired position of the final substrate 171 is pressed and bonded to the final substrate 171 through the intermediate transfer film 131 with a back-pushing pin 181. The desired position is coated with the adhesive 173, so that the micro tile element 161 is bonded to the desired position of the final substrate 171.

<Ninth Process>

Figure 26:
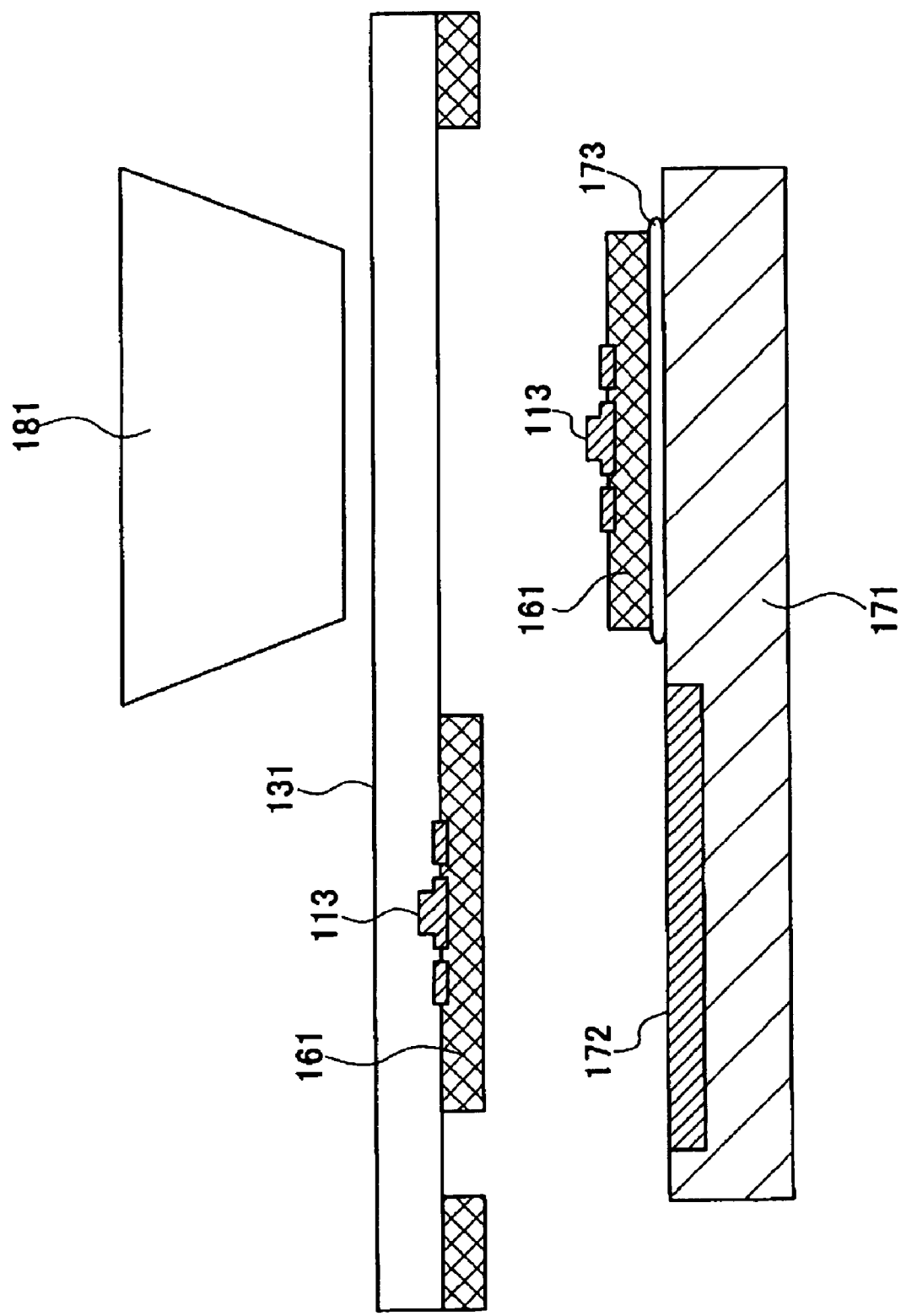
FIG. 26 is a schematic sectional view showing a ninth process of the method of manufacturing the micro tile element.

FIG. 26 is a schematic sectional view showing a ninth process of the method of manufacturing the micro tile element. In the present process, adhesion of the intermediate transfer film 131 is eliminated so as to peel the intermediate transfer film 131 from the micro tile element 161.

The adhesive of the intermediate transfer film 131 loses adhesion with UV or heat. When the adhesive is UV curable, using the back-pushing pin 181 made of a transparent material and irradiating UV from a tip of the back-pushing pin 181 reduce the adhesion of the intermediate transfer film 131. When the adhesive is heat curable, it is sufficient that the back-pushing pin 181 is heated to reduce the adhesion. Alternatively, the adhesion of all over the intermediate transfer film 131 may be reduced to some extent by irradiating all over the intermediate transfer film 131 with UV. Even when the adhesion is reduced to some extent, actually the adhesion remains somewhat, so that the intermediate transfer film 131 retains the micro tile element 161, which is thin and light.

<Tenth Process>

The tenth process is not shown in a drawing. In the present process, the micro tile element 161 is definitely bonded to the final substrate 171 by heat treatment and the like.

<Eleventh Process>

Figure 27:
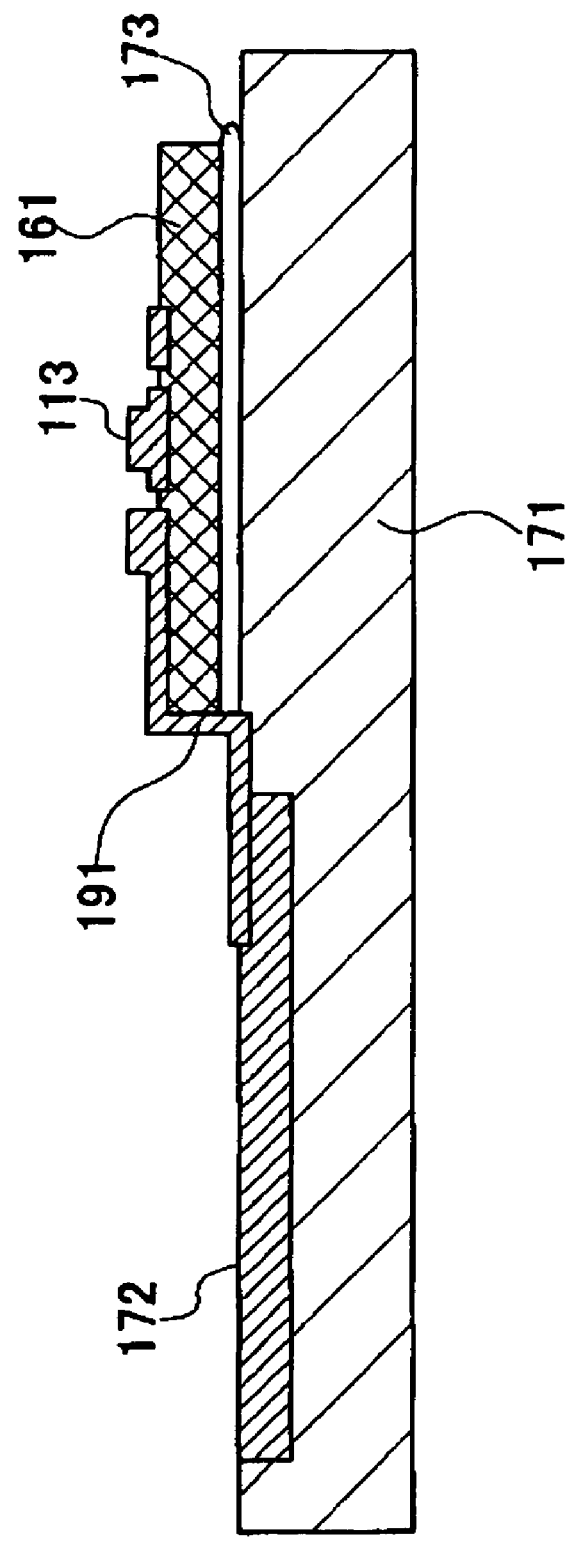
FIG. 27 is a schematic sectional view showing an eleventh process of the method of manufacturing the micro tile element.

FIG. 27 is a schematic sectional view showing an eleventh process of the method of manufacturing the micro tile element. In the present process, an electrode of the micro tile element 161 and a circuit on the final substrate 171 are electrically connected to each other with a wiring 191 so as to form an LSI chip (integrated circuit chip for the optical interconnection circuit) and the like. A quartz substrate or a plastic film as well as a silicon semiconductor may be used for the final substrate 171.

(Exemplary Applications)

Exemplary applications of the optical interconnection circuit between chips according to the present invention are described below.

For example, the optical interconnection circuit between chips of the above exemplary embodiments is used as a signal transmission device in an optoelectronics integrated circuit. The optoelectronics integrated circuit is represented by a computer. Furthermore, an LSI chip forming a CPU is flip-chip mounted onto the substrate 10, while an LSI chip forming a storage device and the like is also flip-chip mounted onto the substrate 10. In addition, although signal processing in an LSI chip forming a CPU is performed by using an electrical signal, the optical interconnection circuit between chips of the above exemplary embodiment is applied to a bus transmitting a datum between a CPU and a storage device and the like.

According to this application, a signal transmission speed of a bus, which is a bottleneck of a processing speed of a computer, can be greatly enhanced with a simple structure compared to a related art one. In addition, a computer system and the like can be greatly downsized.

(Exemplary Electronic Equipment)

Examples of electronic equipment including the optical interconnection circuit between chips or the flat panel display of the above exemplary embodiments are described below.

Figure 28:
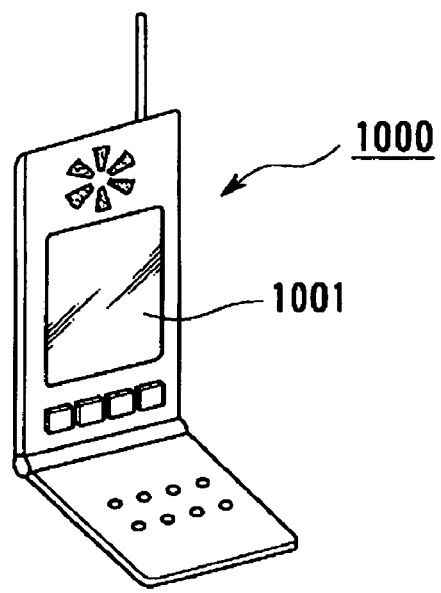
FIG. 28 is a schematic showing one example of electronic equipment including a circuit of an exemplary embodiment of the present invention.

FIG. 28 is a perspective view showing one example of a cellular phone. In FIG. 28, reference numerals 1000 and 1001 show a main body of a cellular phone using the optical interconnection circuit between chips and a display part using the flat panel display (the electrooptical device), respectively.

Figure 29:
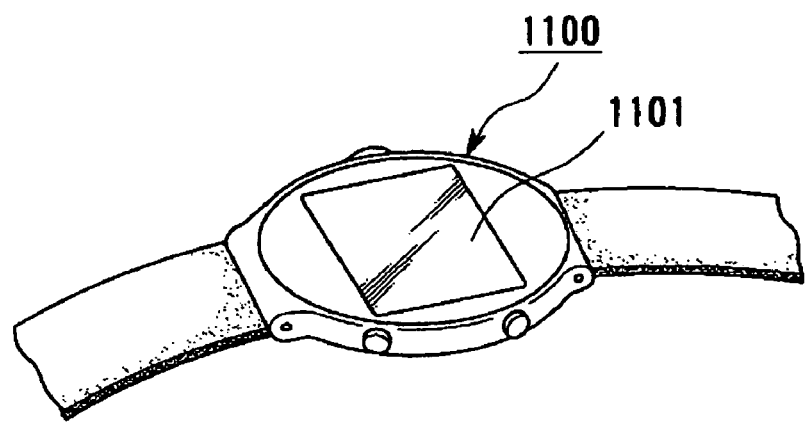
FIG. 29 is a schematic showing one example of the electronic equipment including the circuit of an exemplary embodiment of the present invention.

FIG. 29 is a perspective view showing one example of wristwatch electronic equipment. In FIG. 29, reference numerals 1000 and 1101 show a main body of wristwatch electronic equipment using the optical interconnection circuit between chips and a display part using the flat panel display (the electrooptical device), respectively.

Figure 30:
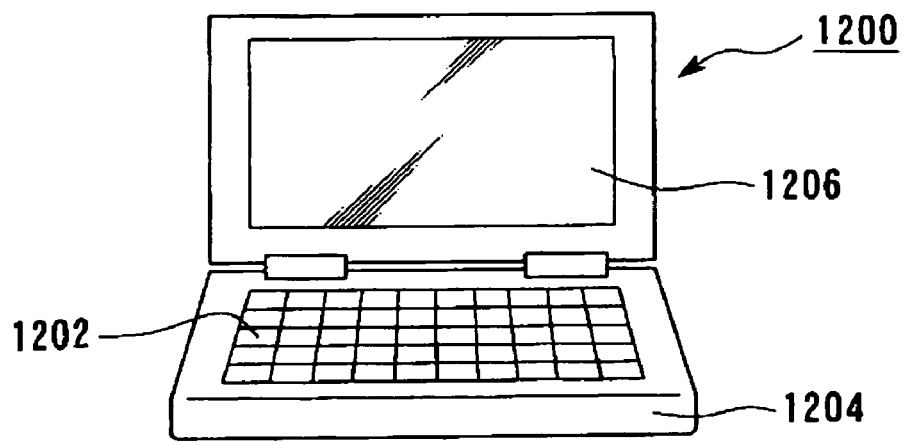
FIG. 30 is a schematic showing one example of the electronic equipment including the circuit of an exemplary embodiment of the present invention.

FIG. 30 is a perspective view showing one example of a portable information processing device, such as a word processor and a personal computer, for example. In FIG. 30, reference numerals 1200 shows an information processing device, 1202 an input device, such as a key board, 1204 a main body of an information processing device using the optical interconnection circuit between chips, and 1206 a display part using the flat panel display (the electrooptical device).

The electronic equipment shown in FIG. 28 through FIG. 30 include the optical interconnection circuit between chips or the flat panel display of the above exemplary embodiments. Therefore, they are superior in display quality, and especially, have a bright and large screen which responses at high speed. This also enables electronic equipment to be enhanced in performance and be downsized compared to a related art one. Furthermore, using the optical interconnection circuit between chips of the above exemplary embodiment enables manufacturing cost to be reduced compared to a related art one.

The scope of the art of the present invention is not limited to the above exemplary embodiments, and instead applied to various kinds of modifications within the spirit of the present invention. The concrete materials, structures, and the like included in the exemplary embodiments are just part of examples and can be accordingly modified.

What is claimed is:

1. An optical interconnection circuit between chips, comprising:

a substrate;

a first element having a light emitting function provided on the substrate by an adhesive;

a second element having a light receiving function provided on the substrate by an adhesive;

an optical wave-guide that optically connects the first element and the second element with each other, and that includes an optical wave-guide member formed on the substrate, the optical wave-guide being in physical contact with and covering at least a part of a light receiving part of the second element, wherein an optical signal not only enters the second element, but also passes over the second element enabling the optical signal to be almost simultaneously sent from the first element to the second element; and an electrode provided on the substrate and connected to at least one of the first element and the second element.

2. The optical interconnection circuit between chips according to claim 1, the optical wave-guide being in contact with and covering at least a part of a light emitting part of the first element; and the electrode being a bonding pad which is a wiring electrode for an integrated circuit chip mounted onto the substrate.

3. The optical interconnection circuit between chips according to claim 1, the electrode being a bonding pad in a case of an integrated circuit chip being flip-chip mounted onto the substrate.

4. The optical interconnection circuit between chips according to claim 2, further including a bump composed of a convex conductive member and formed on the integrated circuit chip, the bump being electrically connected to at least one of an input terminal and an output terminal of the integrated circuit chip, and being bonded to the electrode.

5. The optical interconnection circuit between chips according to claim 1, a plurality of integrated circuit chips being mounted onto the substrate; and a signal being transmitted among the plurality of integrated circuit chips via at least the first element, the second element, and the optical wave-guide.

6. The optical interconnection circuit between chips according to claim 1, further comprising additional second elements optically connected to the optical wave-guide.

7. The optical interconnection circuit between chips according to claim 1, the first element emitting light which is to be a clock signal.

8. An optical interconnection circuit between chips, comprising:

a substrate;

a plurality of first elements having a light emitting function fixed on the substrate by an adhesive;

a plurality of second elements having a light receiving function fixed on the substrate by an adhesive;

a plurality of optical wave-guides that include an optical wave-guide member formed on the substrate; and a plurality of integrated circuit chips that are mounted onto the substrate, the plurality of integrated circuit chips including an integrated circuit to time control and an integrated circuit to provide driving, at least one of the plurality of optical wave-guides provided between the integrated circuit to time control and the integrated circuit to provide driving, and the at least one of the plurality of optical wave-guides optically connecting at least one of the plurality of first elements and at least one of the plurality of second elements, wherein an optical signal not only enters at least one of the plurality of second elements, but also passes over the at least one of the plurality of the second elements enabling the optical signal to be almost simultaneously sent from at least one of the first elements to the at least one of the second elements while being transmitted to another one of the plurality of second elements.

9. The optical interconnection circuit between chips according to claim 8, further including a plurality of the integrated circuits to provide driving, at least one of the plurality of optical wave-guides being provided for each of the plurality of the integrated circuits to provide driving.

10. The optical interconnection circuit between chips according to claim 9, the integrated circuit to time control being connected to a number of the plurality of first elements that is larger than the number of the integrated circuits to provide driving.

11. The optical interconnection circuit between chips according to claim 8, the integrated circuit to provide driving being electrically connected to at least one of the plurality of second elements.

12. The optical interconnection circuit between chips according to claim 1, the optical wave-guide being treated to prevent extraneous light from entering the optical wave-guide.

13. The optical interconnection circuit between chips according to claim 8, the plurality of first elements emitting a light having at least two kinds of wavelengths that are different from each other to the plurality of optical wave-guides.

14. The optical interconnection circuit between chips according to claim 1, the optical wave-guide including a light scattering mechanism scattering a light emitted by the first element.

15. The optical interconnection circuit between chips according to claim 14, the light scattering mechanism being composed of a resin into which a light scattering particle is mixed.

16. The optical interconnection circuit between chips according to claim 14, the light scattering mechanism being composed of a resin of which a surface is processed to include an irregularity thereon.

17. The optical interconnection circuit between chips according to claim 14, the light scattering mechanism being composed of the optical wave-guide member of which at least one of the line width and the height differ from the other.

18. The optical interconnection circuit between chips according to claim 14, the light scattering mechanism being composed of at least one of a resin and a glass in which a light scattering particle is dispersed, and being dome-shaped.

19. An electrooptical device, comprising:

the optical interconnection circuit between chips according to claim 1.

20. An electronic equipment, comprising:

the optical interconnection circuit between chips according to claim 1.

* * * * *